United States Patent
Patel et al.

(10) Patent No.: US 7,629,190 B2
(45) Date of Patent: *Dec. 8, 2009

(54) METHOD FOR MAKING A MICROMECHANICAL DEVICE BY USING A SACRIFICIAL SUBSTRATE

(75) Inventors: Satyadev R. Patel, Sunnyvale, CA (US); Andrew G. Huibers, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 294 days.

This patent is subject to a terminal disclaimer.

(21) Appl. No.: 11/094,086

(22) Filed: Mar. 29, 2005

(65) Prior Publication Data

US 2005/0170546 A1 Aug. 4, 2005

Related U.S. Application Data

(63) Continuation of application No. 10/099,314, filed on Mar. 15, 2002, now Pat. No. 6,900,072, and a continuation-in-part of application No. 10/005,308, filed on Dec. 3, 2001, now Pat. No. 6,996,635.

(60) Provisional application No. 60/276,222, filed on Mar. 15, 2001.

(51) Int. Cl.
*H01L 21/00* (2006.01)

(52) U.S. Cl. .................................. 438/48; 257/E29.324

(58) Field of Classification Search ......... 257/414–416, 257/E29.324; 359/120; 438/106, 48–50
See application file for complete search history.

(56) References Cited

U.S. PATENT DOCUMENTS 4,178,077 A   12/1979   Te Velde
4,309,242 A   1/1982    Te Velde (Continued)

FOREIGN PATENT DOCUMENTS

EP   1097901 A2   5/2001

(Continued)

OTHER PUBLICATIONS

Henry Chu, et al., "DMD superstructure Characterizations", Jul.-Sep. 1998, pp. 75-86.

(Continued)

*Primary Examiner*—Nathan W Ha
(74) *Attorney, Agent, or Firm*—Charles A. Bell; Wade James Brady, III; Frederick J. Telecky, Jr.

(57) ABSTRACT

A method is disclosed for forming a micromechanical device. The method includes fully or partially forming one or more micromechanical structures multiple times on a first substrate. A second substrate is bonded onto the first substrate so as to cover the multiple areas each having one or more micromechanical structures, so as to form a substrate assembly. The substrate assembly is then separated into individual dies, each die having the one or more micromechanical structures held on a portion of the first substrate, with a portion of the second substrate bonded to the first substrate portion. Finally, the second substrate portion is removed from each die to expose the one or more micromechanical structures on the first substrate portion. The invention is also directed to a method for forming a micromechanical device, including: forming one or more micromechanical structures in one or more areas on a first substrate; bonding caps onto the first substrate so as to cover the one or more areas each having one or more micromechanical structures, so as to form a substrate assembly; after a period of time, removing the caps to expose the one or more micromechanical structures. During the period of time between bonding the caps and later removing the caps, the substrate assembly can be singulated, inspected, irradiated, annealed, die attached, shipped and/or stored.

46 Claims, 17 Drawing Sheets

U.S. PATENT DOCUMENTS

| | | | |
|---|---|---|---|
| 5,061,049 | A | 10/1991 | Hornbeck |
| 5,293,511 | A | 3/1994 | Poradish et al. |
| 5,445,559 | A | 8/1995 | Gale et al. |
| 5,527,744 | A | 6/1996 | Mignardi et al. |
| 5,535,047 | A * | 7/1996 | Hornbeck ............... 359/295 |
| 5,835,256 | A | 11/1998 | Huibers |
| 5,872,046 | A | 2/1999 | Kaeriyama et al. |
| 5,915,168 | A | 6/1999 | Salatino et al. |
| 5,963,289 | A | 10/1999 | Stefanov et al. |
| 5,999,306 | A * | 12/1999 | Atobe et al. ............. 359/295 |
| 6,046,840 | A | 4/2000 | Huibers |
| 6,072,236 | A | 6/2000 | Akram et al. |
| 6,088,474 | A | 7/2000 | Dudasko et al. |
| 6,165,885 | A | 12/2000 | Gaynes et al. |
| 6,172,797 | B1 | 1/2001 | Huibers |
| 6,207,548 | B1 | 3/2001 | Akram et al. |
| 6,232,150 | B1 | 5/2001 | Lin et al. |
| 6,252,229 | B1 | 6/2001 | Hays et al. |
| 6,287,940 | B1 | 9/2001 | Cole et al. |
| 6,303,986 | B1 | 10/2001 | Shook |
| 6,306,564 | B1 * | 10/2001 | Mullee ..................... 430/329 |
| 6,323,550 | B1 | 11/2001 | Martin et al. |
| 6,337,760 | B1 | 1/2002 | Huibers et al. |
| 6,353,492 | B2 | 3/2002 | McClelland et al. |
| 6,356,378 | B1 | 3/2002 | Huibers |
| 6,388,661 | B1 | 5/2002 | Richards |
| 6,403,403 | B1 * | 6/2002 | Mayer et al. ............. 438/132 |
| 6,523,961 | B2 * | 2/2003 | Ilkov et al. ............... 353/99 |
| 6,900,072 | B2 * | 5/2005 | Patel et al. ............... 438/106 |
| 6,962,830 | B1 * | 11/2005 | Behin et al. .............. 438/50 |
| 7,057,246 | B2 | 6/2006 | Reid |
| 2001/0007372 | A1 | 7/2001 | Akram et al. |
| 2001/0022207 | A1 | 9/2001 | Hays et al. |
| 2001/0034076 | A1 | 10/2001 | Martin |
| 2003/0218753 | A1 | 11/2003 | Reuter |
| 2003/0223084 | A1 | 12/2003 | Mehri et al. |
| 2004/0042000 | A1 | 3/2004 | Mehri et al. |
| 2004/0223240 | A1 * | 11/2004 | Huibers ..................... 359/850 |

FOREIGN PATENT DOCUMENTS

| | | | |
|---|---|---|---|
| EP | 1101730 | A2 | 5/2001 |
| EP | 1167281 | A2 | 1/2002 |
| JP | 09159937 | A * | 6/1997 |
| JP | 2001129800 | A | 5/2001 |
| JP | 2001144117 | A | 5/2001 |
| JP | 2001196484 | A | 7/2001 |
| WO | WO-01/10718 | A1 | 2/2001 |
| WO | WO-01/20671 | A1 | 3/2001 |
| WO | WO-02/12116 | A2 | 2/2002 |
| WO | WO-02/12116 | A3 | 2/2002 |

OTHER PUBLICATIONS

W.N. Sharpe, et al. "Tensile testing of MEMS materials-recent progress". Journal of Materials Science 38 (2003), pp. 4075-4079.

T.E. Buchheit, et al., "Micromechanical testing of MEMS materials", Journal of Materials Science 38 (2003), pp. 4081-4086.

S.M. Allameh, et al., "An introduction to mechanical- properties-related issues in MEMS structures", Journal of Materials Science 38 (2003), pp. 4115-4123.

S.M. Allameh, et al., Surface topography evolution and fatigue fracture of polysilicon, Journal of Materials Science 38 (2003), pp. 4145-4155.

Ken Gall, et al., "Thermomechanical response of bare and $Al_2O_3$ — nanocoated Au/Si bilayer beams for micromechanical systems", J. Mater. Res., vol. 18, No. 7, Jul 2003, pp. 1575-1587.

Tom Glenn, et al., Packaging Microscopic Machines, Machine Design, Dec. 7, 2000.

Balaji Sridharan, et al., Post-Packaging Release a New Concept for Surface Micromachined Devices, Mechanical and Aerospace Engineering Department, 4 pgs.

U. Gosele, et al., Wafer Bonding for Microsystems Technologies, Sensors and Actuators 74 (1999) pp. 161-168.

Masao Segawa, et al., A CMOS Inage Sensoer Module Applied for a Digital Still Camera Utilizing the Tab on Glass (TOG) Bonding Method, IEEE Transactions on Advanced Packaging, vol. 22., No. 2.

In-Byeong Kang, et al., The Application of Anisotropic Conductive Films for Realisation of Interconnects in Micromechanical Structures, SPIE vol. 3321, pp. 233-238.

Sonja van der Groen, et al., CMOS Compatible Wafer Scale Adhesive Bonding for Circuit Transfer, International Conference on Solid-State Sensors and Actuators, Chicago, Jun. 16-19, 1997, pp. 629-632.

G. Blink, et al., Wafer Bonding With an Adhesive Coating, Part of the SPIE Conference on Micromachined Devices and Components IV, Santa Clara, California ,Sep. 1998, pp. 50-61.

Christine Kallmayer, et al., A New Approach to VHIP Size Package Using Meniscus Soldering and FPC-Bonding, IEEE Transactions on Components Packaging and Manufacturing Technology-Part C., vol. 21, No. 1., Jan. 1998, pp. 51-56.

Joachim Kloeser, et al., Low Cost Bumping by Stencil Printing: Process Qualification for 200 UM Pitch, 1998 International Synposium on Microelectronics, 11 Pgs.

Michel M. Maharbiz, et al., Batch Micropackaging by Conpression-Bonded Wafer-Wafer Transfer, Microassembly Technologies, Inc, 8 Pgs.

Bharat Shivkumar, et al., Microrivets for MEMS Packaging:Concept, Fabriaction, and Strength Testing, Journal of Microlectroomechanical Systems, vol. 6, No. 3, Sep. 1997, pp. 217-224.

Hideki Takagi, et al., Room Temperature Silicon Wafer Direct Bonding in Vacuum by Ar Beam Irradiation, Mechanical Engineering Laboratory, AIST. MITI., 6 Pgs.

Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMS, 10 Pgs.

T.P. Glenn, et al., Designing MEMS Into Systems: Packaging Issues, http://www.ecnmag.com, 4 Pgs.

Espinosa et al., "Identification of Residual Stress State in an RF-MEMS Device", MTS Systems Corporation white paper (May 2000).

Franka et al., "Solder Bump Technology: Present and Future", Semiconductor Fabtech (May 1995).

Glenn et al., "Packaging Microscopic Machines", Machine Design (Dec. 7, 2000).

Harsh et al., "Flip-Chip Assembly for Si-Based MEMS", Proceedings of the 1999 IEEE International Conference on Microelectromechanical Systems (MEMS '99), Orlando, FL (Jan. 17-21, 1999), pp. 273-278.

Irwin at al., "Quick Prototyping of Flip Chip Assembly with MEMS", University of Colorado at Boulder white paper (Jul. 17, 2000).

Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).

Lee et al., "High-Q Tunable Capacitors and Multi-way Switches Using MEMS for Millimeter-Wave Applications", portions of slide presentation from the NSF Center for Advanced Manufacturing and Packaging of Microwave. Optical and Digital Electronics at the University of Colorado at Boulder (Sep. 1998).

Lee et al., "Use of Foundry Services to Prototype MEMS for Millimeter-wave Applications", portions of slide presentation from the NSF Center for Advanced Manufacturing and Packaging of Microwave. Optical and Digital Electronics at the University of Colorado at Boulder (1998).

Luxbacher, T., "Spray Coating for MEMS, Interconnect & Advanced Packaging Applications", HDI Magazine (May 1999) (abstract only).

Moore, D., "Automation Requirements for Die Bonding Process", Electronics Engineer (Jul. 2000).

Tsau, C., "Wafer-Level Packaging", MIT Microsystems Technology Laboratories Annual Report (May 2000), p. 49.

Mehregany, M., et al., "SiC MEMS: Opportunities and Challenges for Applications in Harsh Environments," Thin Solid Films, 355-356, 1999, pp. 518-524.

* cited by examiner

METHOD FOR MAKING A MICROMECHANICAL DEVICE BY USING A SACRIFICIAL SUBSTRATE

CROSS-REFERENCE TO RELATED PATENT APPLICATIONS

This is a continuation of U.S. patent application Ser. No. 10/099,314 filed Mar. 15, 2002, now U.S. Pat. No. 6,900,072, issued May 31, 2005, which claims priority to provisional application 60/276,222 to Patel et al. filed Mar. 15, 2001 and is a continuation-in-part of U.S. application Ser. No. 10/005,308 to Patel et al. filed Dec. 3, 2001, now U.S. Pat. No. 6,996,635, issued Nov. 29, 2005, both applications being incorporated herein by reference.

BACKGROUND

1. Field of Invention

A wide variety of micro-electromechanical devices (MEMS) are known, including accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. Though the processes for making the various MEMS devices may vary, they all share the need for high throughput manufacturing (e.g. forming multiple MEMS devices on a single substrate without damage to the microstructures formed on the substrate). The subject matter of the present invention is related to manufacturing of multiple MEMS devices on a substrate, singulating the substrate and packaging each substrate portion with one or more MEMS devices thereon, without damaging the MEMS microstructures thereon.

2. Related Art

As disclosed in U.S. Pat. No. 5,061,049 to Hornbeck, silicon wafers are processed to form an array of deflectable beams, then the wafers are diced into chips, followed by further processing of the individual chips. This process has disadvantages, as disclosed in U.S. Pat. No. 5,445,559 to Gale et al. Once the mirror is formed by etching the sacrificial material to form an air gap between the deflectable beam and a lower electrode, the device is very fragile. The device cannot be exposed to liquids during wafer cleanup steps, without destroying the mirror. "Therefore, the devices must be cut and the dicing debris washed away before etching the sacrificial layer away from the mirror. This requires that the cleaning and etching steps, and any following steps, including testing be performed on the individual chips instead of a wafer." To address this problem, Gale et al. propose using a vacuum fixture with a plurality of headspaces above the mirrors to prevent contact with the mirrors. The headspaces are evacuated through vacuum ports and the backside of the wafer is ground down to partially sawn kerfs in order to separate the devices. Then the separated devices and the vacuum fixture are washed to remove any debris from the separation operation. The devices with mirrors exposed are finally ready for packaging.

In U.S. Pat. No. 5,527,744 to Mignardi et al., it is likewise desired to avoid damaging the mirror elements when cutting the wafer into individual dies. In Mignardi et al., a partial saw or scribe is performed on the wafer after optionally putting a removable protective coating over the entire wafer to further limit debris from the partial saw or scribe from settling on the mirrors. Then, the protective coating if used and the debris from the partial saw are removed in a post-saw cleaning. Typically the sacrificial layer is then removed, and additional processes may also take place to cover or protect various surfaces of the device that were not exposed previous to removing the sacrificial layer. Last, in order to separate the wafer into individual devices, tape is aligned and applied to the wafer, covering the partially sawed areas. The wafer is broken and the tape is treated with UV light to weaken it and then is peeled away. The individual devices with exposed mirrors must then be carefully picked and placed off of the saw frame and packaged.

U.S. Pat. No. 5,872,046 to Kaeriyama et al., discloses partially fabricating a micromirror structure on a semiconductor wafer, followed by coating the wafer with a protective layer. Then, streets are sawed in the wafer (defining the individual dies), which is followed by cleaning the wafer with a solution of an alkyl glycol and HF. Further processing includes acoustically vibrating the wafer in deionized water. Finally the mirrors are released and the wafer broken along the streets.

SUMMARY OF THE INVENTION

As can be seen from the above, great care must be taken to avoid damaging or contaminating the delicate microstructures. Many time consuming and expensive steps can be involved in order to protect the mirror elements prior to singulating and packaging, and even with such protective measures, the mirrors can still be excessively exposed to potential damage. What is needed is an easier and less expensive way to make, assemble and ultimately package MEMS devices, such as mirror arrays, that avoids the problems of the prior art. In the present invention, a method is provided where the wafer substrate holding the microstructures is bonded to a sealing wafer to form a wafer assembly, which sealing wafer is removed after singulation (scribing, scoring, cutting, grinding or otherwise separating the wafer assembly into individual dies). The time that the mirrors are exposed is minimized by having the microstructures encased between two wafers prior to separation into individual dies.

A method is thus provided for forming a MEMS device, comprising providing a first wafer to hold a plurality of microstructures, providing a sealing wafer, forming a plurality of MEMS elements on the first wafer, bonding the first wafer and sealing wafer together as a wafer assembly, singulating the wafer assembly into individual dies, and finally removing the sealing wafer portion at the die level. The MEMS elements formed can be released prior to bonding the first wafer and sealing wafer, or after the sealing wafer portion has been removed. It may also be desirable to add a replacement substrate after removing the sealing wafer portion, which replacement substrate can be of a different material than the sealing wafer. The replacement substrate can be a simple glass substrate or a silicon substrate such as one comprising circuitry for interacting with or otherwise actuating the microstructures on the first wafer portion.

The invention is also directed to a method for forming a micromechanical device, comprising: fully or partially forming one or more micromechanical structures multiple times on a first substrate; bonding a second substrate onto the first substrate so as to cover the multiple areas each having one or more micromechanical structures, so as to form a substrate assembly; separating the substrate assembly into individual dies, each die having the one or more micromechanical structures held on a portion of the first substrate, with a portion of the second substrate bonded to the first substrate portion; and removing the second substrate portion from each die to expose the one or more micromechanical structures on the first substrate portion.

The invention is further directed to a method for forming a plurality of micromirror arrays comprising micromirrors, the method comprising: forming micromirror arrays multiple times on a first substrate; bonding a second substrate onto the first substrate so as to cover the multiple areas each having a micromirror array, so as to form a substrate assembly; separating the substrate assembly into individual dies, each die having a micromirror array on a portion of the first substrate with a portion of the second substrate bonded to the first substrate portion; and removing the second substrate portion from each die to expose the one or more micromechanical structures on the first substrate portion.

The invention is also directed to a method for forming a micromechanical device, comprising: forming one or more micromechanical structures in one or more areas on a first substrate; bonding caps onto the first substrate so as to cover the one or more areas each having one or more micromechanical structures, so as to form a substrate assembly; after a period of time, removing the caps to expose the one or more micromechanical structures. During the period of time between bonding the caps and later removing the caps, the substrate assembly can be singulated, inspected, irradiated, annealed, die attached, shipped and/or stored.

DETAILED DESCRIPTION

Mirror Fabrication:

Processes for microfabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple microstructures or microstructure arrays are to be formed and which allows for being divided into dies, each die having one or more microstructures thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6" or 12" in diameter) so as to allow for manufacture in a standard foundry.

Figure 1A:
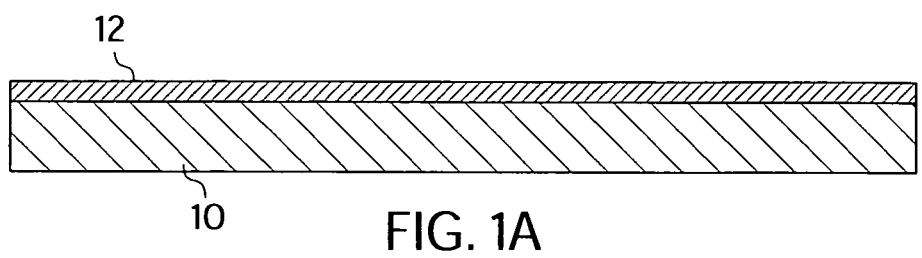
FIGS. 1A to 1E illustrate one method for forming micromirrors.

FIGS. 1A to 1D show a manufacturing process for a micromechanical mirror structure. As can be seen in FIG. 1A, a substrate such as glass (e.g. 1737 F), quartz, Pyrex™, sapphire, (or silicon alone or with circuitry thereon) etc. is provided. The cross section of FIGS. 1A-D is taken along line 1-1 of FIG. 2. Because this cross section is taken along the hinge of the movable element, an optional block layer 12 can be provided to block light (incident through the light transmissive substrate during use) from reflecting off of the hinge and potentially causing diffraction and lowering the contrast ratio (if the substrate is transparent).

Figure 1B:
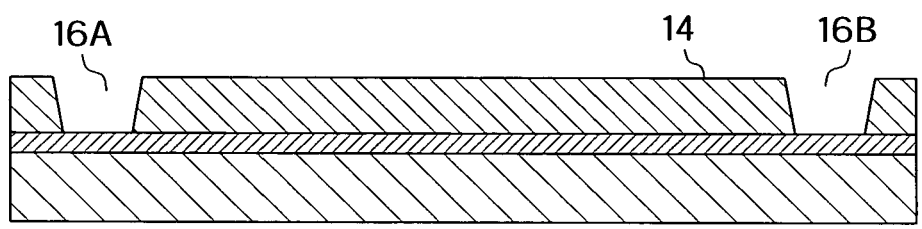

As can be seen in FIG. 1B, a sacrificial layer 14, such as amorphous silicon, is deposited. The thickness of the sacrificial layer can be wide ranging depending upon the movable element/mirror size and desired tilt angle, though a thickness of from 500 Å to 50,000 Å, preferably around 5000 Å is preferred. Alternatively the sacrificial layer could be a polymer or polyimide (or even polysilicon, silicon nitride, silicon dioxide, etc. depending upon the materials selected to be resistant to the etchant, and the etchant selected). A lithography step followed by a sacrificial layer etch forms holes 16a,b in the sacrificial silicon, which can be any suitable size, though preferably having a diameter of from 0.1 to 1.5 um, more preferably around 0.7+/−0.25 um. The etching is performed down to the glass/quartz substrate or down to the block layer if present. Preferably if the glass/quartz layer is etched, it is in an amount less than 2000 Å.

Figure 1C:
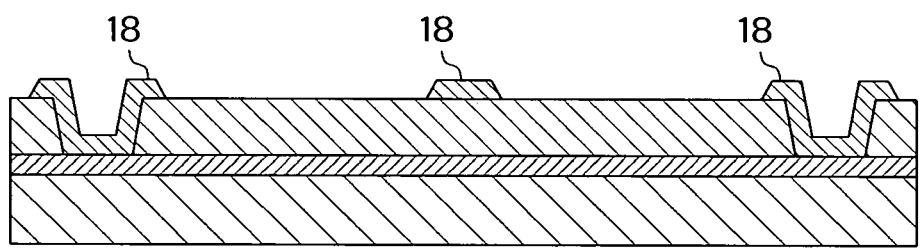

At this point, as can be seen in FIG. 1C, a first layer 18 is deposited by chemical vapor deposition. Preferably the material is silicon nitride or silicon oxide deposited by LPCVD or PECVD, however polysilicon, silicon carbide or an organic compound could be deposited at this point (of course the sacrificial layer and etchant should be adapted to the material used). The thickness of this first layer can vary depending upon the movable element size and desired amount of stiffness of the element, however in one embodiment the layer has a thickness of from 100 to 3200 Å, more preferably around 1100 Å. The first layer undergoes lithography and etching so as to form gaps between adjacent movable elements on the order of from 0.1 to 25 um, preferably around 1 to 2 um.

Figure 1D:
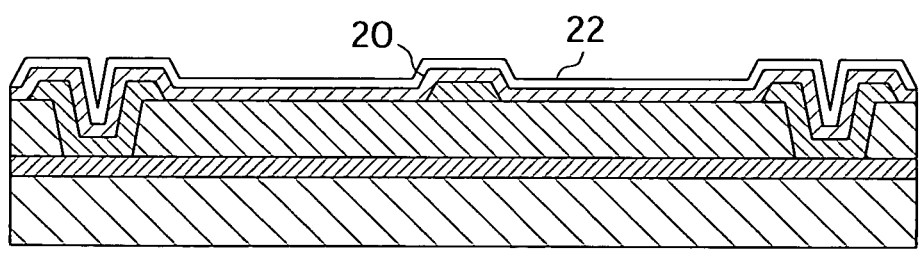
Figure 1E:
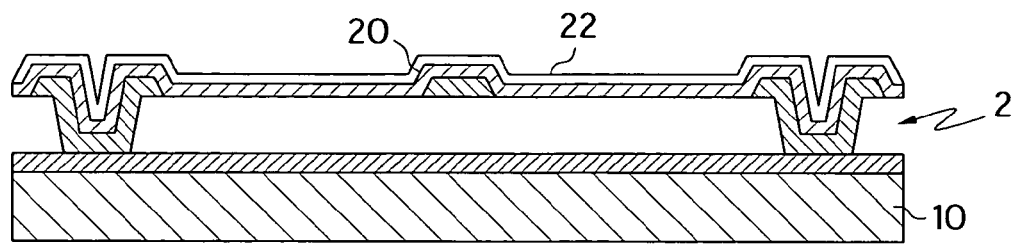
Figure 2:
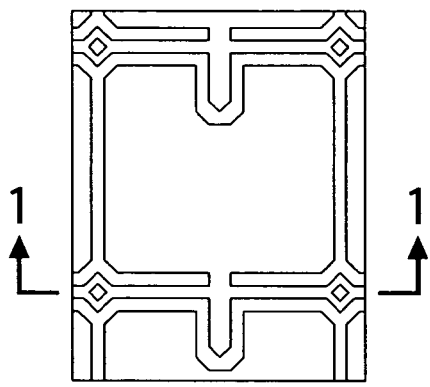
FIG. 2 is a top view of a micromirror showing line 1-1 for taking the cross section for FIGS. 1A to 1E.
Figure 3A:
FIGS. 3A to 3E illustrate the same method as in FIGS. 1A to 1D but taken along a different cross section.
Figure 3B:
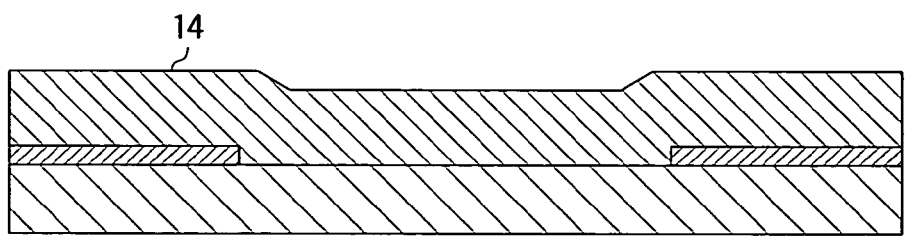
Figure 3C:
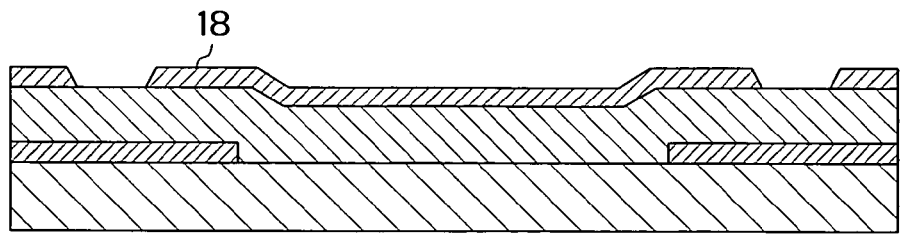
Figure 3D:
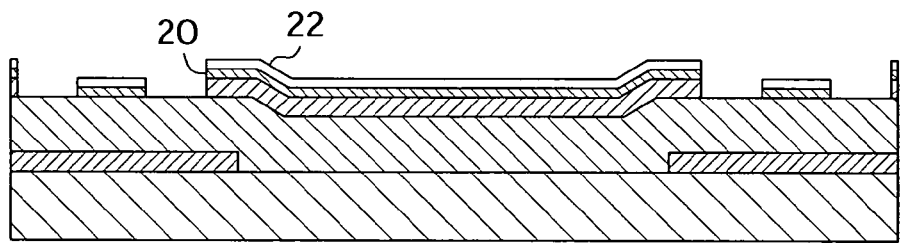
Figure 3E:
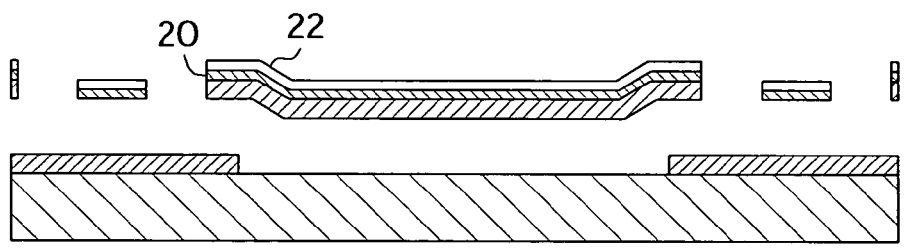
Figure 4:
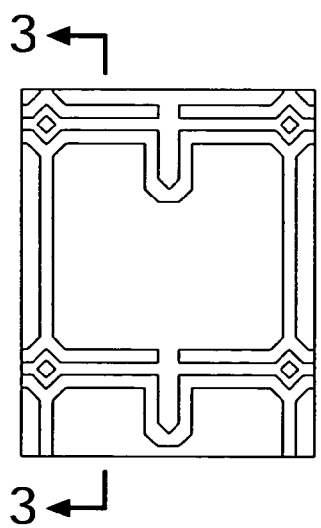
FIG. 4 is a top view of a mirror showing line 3-3 for taking the cross section for FIGS. 3A to 3E.

A second layer 20 (the "hinge" layer) is deposited as can be seen in FIG. 1D. By "hinge layer" it is meant the layer that defines that portion of the device that flexes to allow movement of the device. The hinge layer can be disposed only for defining the hinge, or for defining the hinge and other areas such as the mirror. In any case, the reinforcing material is removed prior to depositing the hinge material. The material for the second (hinge) layer can be the same (e.g. silicon nitride) as the first layer or different (silicon oxide, silicon carbide, polysilicon, etc.) and can be deposited by chemical vapor deposition as for the first layer. The thickness of the second/hinge layer can be greater or less than the first, depending upon the stiffness of the movable element, the flexibility of the hinge desired, the material used, etc. In one embodiment the second layer has a thickness of from 50 Å to 2100 Å, and preferably around 500 Å. In another embodiment, the first layer is deposited by PECVD and the second layer by LPCVD.

As also seen in FIG. 1D, a reflective and conductive layer 22 is deposited. The reflective/conductive material can be gold, aluminum or other metal, or an alloy of more than one metal though it is preferably aluminum deposited by PVD. The thickness of the metal layer can be from 50 to 2000 Å, preferably around 500 Å. It is also possible to deposit separate reflective and conductive layers. An optional metal passivation layer (not shown) can be added, e.g. a 10 to 1100 Å silicon oxide layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, $CBr_4$, etc.) with an optional preferably inert diluent such as Ar and/or He).

In the embodiment illustrated in FIGS. 1A to 1D, both the first and second layers are deposited in the area defining the movable (mirror) element, whereas the second layer, in the absence of the first layer, is deposited in the area of the hinge. It is also possible to use more than two layers to produce a laminate movable element, which can be desirable particularly when the size of the movable element is increased such as for switching light beams in an optical switch. A plurality of layers could be provided in place of single layer 18 in FIG. 1C, and a plurality of layers could be provided in place of layer 20 and in place of layer 22. Or, layers 20 and 22 could be a single layer, e.g. a pure metal layer or a metal alloy layer or a layer that is a mixture of e.g. a dielectric or semiconductor and a metal. Some materials for such layer or layers that could comprise alloys of metals and dielectrics or compounds of metals and nitrogen, oxygen or carbon (particularly the transition metals) are disclosed in U.S. provisional patent application 60/228,007, the subject matter of which is incorporated herein by reference.

Whatever the specific combination, it is desirable that the reinforcing layer(s) is provided and patterned (at least in the hinge area) prior to depositing and patterning the hinge material and metal. In one embodiment, the reinforcing layer is removed in the area of the hinge, followed by depositing the hinge layer and patterning both reinforcing and hinge layer together. This joint patterning of the reinforcing layer and hinge layer can be done with the same etchant (e.g. if the two layers are of the same material) or consecutively with different etchants. The reinforcing and hinge layers can be etched with a chlorine chemistry or a fluorine (or other halide) chemistry (e.g. a plasma/RIE etch with $F_2$, $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material.

FIGS. 3A to 3D illustrate the same process taken along a different cross section (cross section 3-3 in FIG. 4) and show the optional block layer 12 deposited on the light transmissive substrate 10, followed by the sacrificial layer 14, layers 18, 20 and the metal layer 22. The cross sections in FIGS. 1A to 1D and 3A to 3D are taken along substantially square mirrors in FIGS. 2 and 4 respectively. However, the mirrors need not be square but can have other shapes that may decrease diffraction and increase the contrast ratio. Such mirrors are disclosed in U.S. provisional patent application 60/229,246 to Ilkov et al., the subject matter of which is incorporated herein by reference. Also, the mirror hinges can be torsion hinges as illustrated in this provisional application.

It should also be noted that materials and method mentioned above are examples only, as many other method and materials could be used. For example, the Sandia SUMMiT process (using polysilicon for structural layers) or the Cronos MUMPS process (also polysilicon for structural layers) could be used in the present invention. Also, a MOSIS process (AMI ABN—1.5 um CMOS process) could be adapted for the present invention, as could a MUSiC process (using polycrystalline SiC for the structural layers) as disclosed, for example, in Mehregany et al., Thin Solid Films, v. 355-356, pp. 518-524, 1999. Also, the sacrificial layer and etchant disclosed herein are exemplary only. For example, a silicon dioxide sacrificial layer could be used and removed with HF (or HF/HCl), or a silicon sacrificial could be removed with ClF3 or BrF3. Also a PSG sacrificial layer could be removed with buffered HF, or an organic sacrificial such as polyimide could be removed in a dry plasma oxygen release step. Of course the etchant and sacrificial material should be selected depending upon the structural material to be used. Also, though PVD and CVD are referred to above, other thin film deposition methods could be used for depositing the layers, including spin-on, sputtering, anodization, oxidation, electroplating and evaporation.

After forming the microstructures as in FIGS. 1 to 4 on the first wafer, it is preferably to remove the sacrificial layer so as to release the microstructures (in this case micromirrors). This release can be performed at the die level, though it is preferred to perform the release at the wafer level. FIGS. 1E and 3E show the microstructures in their released state. As can be seen in FIG. 1E, posts 2 hold the released microstructure on substrate 10.

Circuitry:

In the present invention, the circuitry can be formed together on the same substrate as the microstructures, such as in the aforementioned U.S. Pat. Nos. 5,061,049, 5,527,744, and 5,872,046, the subject matter of each being incorporated by reference. If the microstructures and circuitry are formed monolithically on the same first wafer, then after the sealing wafer is removed, a simple final replacement substrate can be added (e.g. a simple semiconductive or insulating substrate (e.g. a silicon, glass, quartz or other substrate) that is bonded to the first wafer portion at the die level after removal of the sealing wafer portion. Of course, if the device is for modulation of light in the visible spectrum such as for an optical switch or a spatial light modulator for a projection display, then the replacement substrate is preferably transmissive to light in the visible spectrum.

If the circuitry is not formed monolithically on the same wafer as the microstructures, then the replacement substrate can comprise circuitry (or, circuitry could be provided on both the first wafer and the replacement substrate if desired). If the microstructures are micromirrors, then it may be preferable to form circuitry and electrodes on the replacement wafer prior to replacing the sealing wafer at the die level. In such a case, it may be preferable for the replacement substrate (the backplane) die to contain a large array of electrodes on a top metal layer of the die, each electrode electrostatically controlling one pixel (one micromirror on the first wafer portion of the die) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, the subject matter of which is incorporated herein by reference.

The display pixels themselves, in a preferred embodiment, are binary, always either fully 'on' or fully 'off,' and so the backplane design is purely digital. Though the micromirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0-5V or as high above 5V as reliability allows. The backplane could also be fabricated in a higher-voltage process such as a foundry Flash memory process using that process's high-voltage devices. The backplane could also be constructed in a high-voltage process with larger-geometry transistors capable of operating at 12V or more. A higher voltage backplane can produce an electrode voltage swing significantly higher than the 5-7V that the lower voltage backplane provides, and thus actuate the pixels more robustly.

In digital mode, it is possible to set each electrode to either state (on/off), and have that state persist until the state of the electrode is written again. A RAM-like structure, with one bit per pixel is one architecture that accomplishes this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light that might otherwise cause leakage.

The perception of a grayscale or full-color image will be produced by modulating pixels rapidly on and off, for example according to the method in the above-mentioned U.S. patent application Ser. No. 09/564,069 to Richards. In order to support this, it is preferable that the backplane allows the array to be written in random-access fashion, though finer granularity than a row-at-a-time is generally not necessary.

It is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row address or other infrequently-used control signals onto the data bus can eliminate separate pins for these functions with a negligible throughput penalty (a few percent, e.g. one clock cycle for address information per row of data is acceptable). A data bus, a clock, and a small number of control signals (5 or less) are all that is necessary.

In use, the die can be illuminated with a 50 W or more arc lamp. The thermal and photo-carrier effects of this may result in special layout efforts to make the metal layers as 'opaque' as possible over the active circuitry to reflect incident optical energy and minimize photocarrier and thermal effects. An on-chip PN diode could be included for measuring the temperature of the die.

In one embodiment the resolution is XGA, 1024×768 pixels, though other resolutions are possible. A pixel pitch of from 5 to 24 um is preferred (e.g. 14 um). The size of the electrode array itself is determined by the pixel pitch and resolution. A 14 um XGA device's pixel array will therefore be 14.336×10.752 mm.

Figure 5:
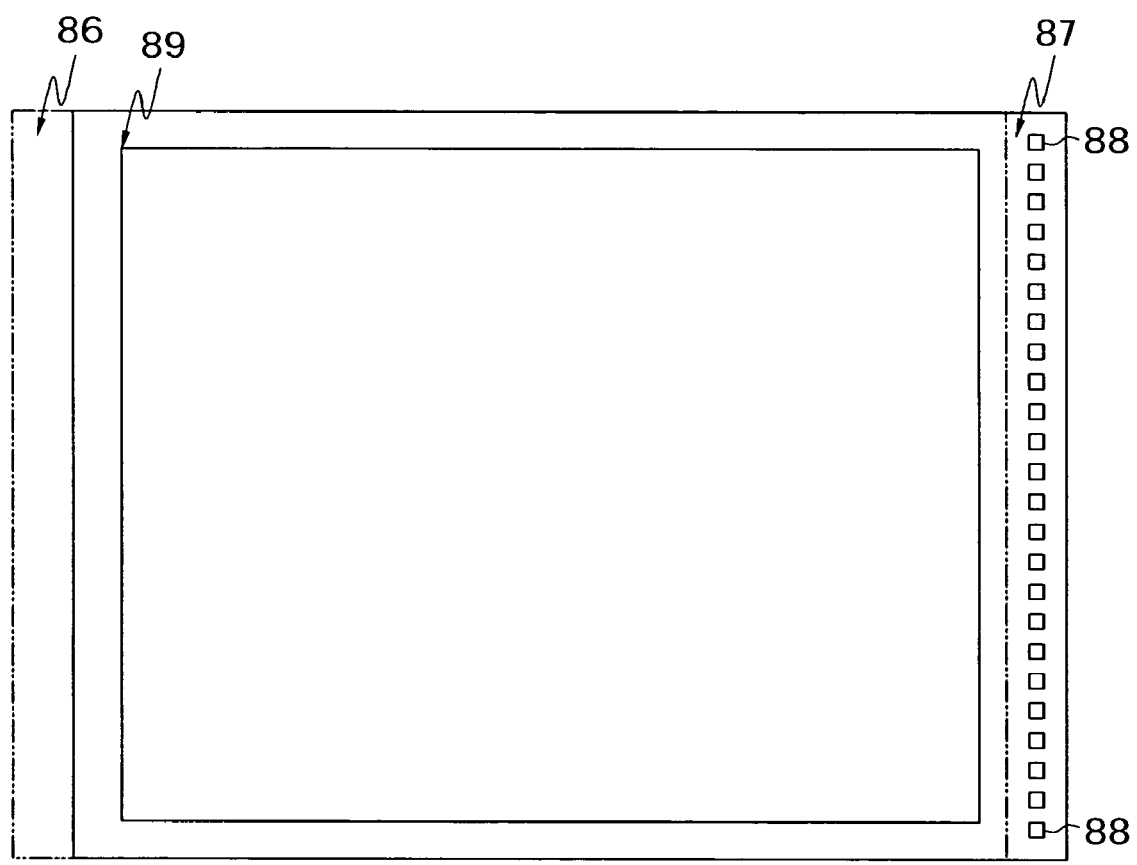
FIG. 5 is an illustration of the I/O pads and Si backplane for the mirror array of the present invention.

As can be seen in FIG. 5, the I/O pads (88) can be placed along the right edge of the die, as the die is viewed with pixel (0,0) (89 in FIG. 5) at the top left corner. Putting the pads on the 'short' (left/right) edge (87) of the die is preferable due to the slightly reduced die size. The choice of whether the I/O should go on the left vs. right edge of the die is of little importance since the display controller ASIC may support mirroring the displayed image in the horizontal axis, the vertical axis, or both. If it is desired to orient the display with the I/O on the left edge, the image may simply be rotated 180 degrees by the external display controller. The electrode voltage during operation is, in the low state 0V and in the high state preferably from 5 to 7 V (or 12V or higher in the higher voltage design). Of course other voltages are possible, though lower actuation voltages are preferred. In one embodiment the electrodes are metal squares, though other geometries are possible. Standard CMOS passivation stackup over the electrodes can be provided.

Figure 6:
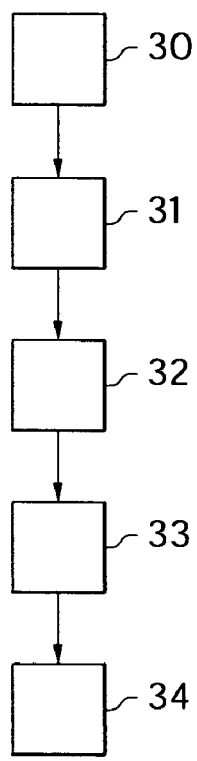
FIG. 6 is a flow chart of one method of the invention.

Assembly:

In one embodiment, the circuitry is formed together with the microstructures on the first wafer (Step 30 in FIG. 6), then the sealing wafer is added at the wafer level (Step 31), the wafer assembly divided into individual dies (Step 32), and the sealing wafer (portion) removed at the die level (Step 33). This can be followed, if desired, by the addition of a replacement substrate at the die level (Step 34), before or during final packaging.

Figure 7:
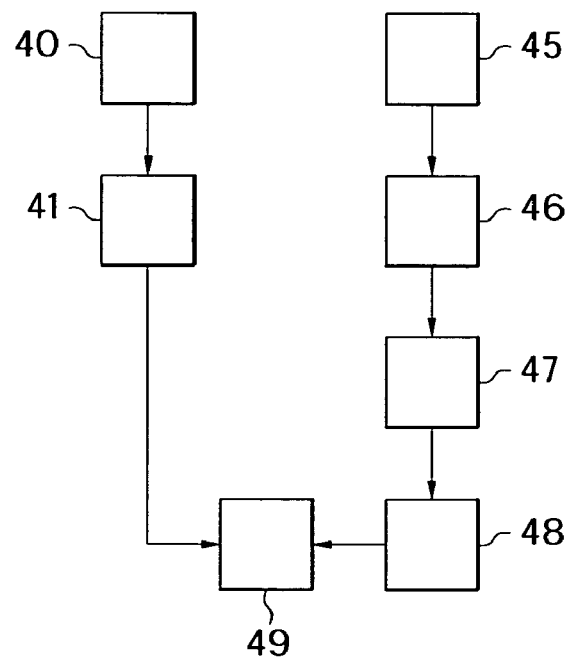
FIG. 7 is a flow chart of an alternative method of the invention.

In another embodiment, if the circuitry is formed on a separate substrate from the microstructures, then it is preferable to form multiple circuit "dies" on a single substrate (Step 40 in FIG. 7), for example on a silicon wafer, followed by separation of the wafer into individual circuit dies (Step 41). Likewise, multiple microstructures or microstructure arrays are formed on the first wafer substrate (Step 45), followed by bonding the first wafer to a sealing wafer (Step 46). This is in turn followed by singulating the assembly of the first and sealing wafers into dies (Step 47) and removing the sealing wafer portion from each die (Step 48). The circuit wafer portion and the first wafer portion with microstructures are aligned and bonded (Step 49) before or during final packaging. The microstructures can be released or unreleased prior to adhering the sealing wafer to the first wafer, though the invention is particularly suited to the more delicate released MEMS devices.

Releasing immediately prior to the application of epoxy or other bonding is preferable (though an anti-stiction treatment or other passivation treatment (or treatment for improving epoxy bond strength) between release and bonding may be desirable). For silicon sacrificial layers, the release can be in an atmosphere of xenon difluoride and an optional diluent (e.g. nitrogen and/or helium). Of course, other etchants could be used, including interhalogens such as bromine trifluoride and bromine trichloride, gas phase or liquid phase HF, or other suitable etchant. The release is preferably a spontaneous chemical etch which does not require plasma or other external energy to etch the silicon sacrificial layer(s). After etching, the remainder of the device can be treated for stiction by applying an anti-stiction layer (e.g. a self assembled monolayer). The layer is preferably formed by placing the device in a liquid or gas silane, preferably a halosilane, and most preferably a chlorosilane. Of course, many different silanes and other materials are known in the art for their ability to provide anti-stiction for MEMS structures.

The bonding of the removable sealing wafer to the first wafer holding the microstructures can be by anodic bonding, metal eutectic bonding, fusion bonding, epoxy bonding, or other wafer bonding processes known in the art. A preferred bonding method is bonding with an IR or UV epoxy such as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. In order to maintain separation between the bonded wafers, spacers can be mixed into the epoxy. The spacers can be in the form of spheres or rods and can be dispensed and dispersed between the first wafer and sealing wafer in order to keep the sealing wafer spaced away from the first wafer (so as to avoid damage to the microstructures on the first wafer). Spacers can be dispensed in the gasket area of the display and therefore mixed into the gasket seal material prior to seal dispensing. This is achieved through normal agitated mixing processes. The final target for the gap between the first wafer and sealing wafer can be from 1 to 100 um. This of course depends upon the type of MEMS structure being encapsulated and whether it was surface or bulk micromachined (bulk micromachined structures may not need any spacers between the two wafers). The spheres or rods can be made of glass or plastic, preferably an elastically deforming material. Alternatively, spacer pillars can be microfabricated on at least one of the wafer substrates. In one embodiment, pillars/spacers are provided only at the edge of the array. In another embodiment, pillars/spacers can be fabricated in the array itself. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers micro-fabricated on the lower wafer (or the upper wafer) and could be made of polyimide, SU-8 photo-resist.

Then, the two wafers are aligned. Because the sealing wafer will eventually be removed and discarded, high precision alignment may not be necessary. If precision alignment is desired, alignment of the opposing electrodes or active viewing areas may involve registration of substrate fiducials on opposite substrates. This task accomplished with the aid of video cameras with lens magnification. The machines range in complexity from manual to fully automated with pattern recognition capability. Whatever the level of sophistication, they accomplish the following process: 1. Dispense a very small amount of a UV curable adhesive at locations near the perimeter and off of all functional devices in the array; 2. Align the fiducials of the opposing substrates within the equipment capability; and 3. Press substrates and UV tack for fixing the wafer to wafer alignment through the remaining bonding process (e.g., curing of the internal epoxy).

The final cell gap can be set by pressing the previously tacked laminates in a UV or thermal press. In a UV press, a common procedure would have the substrates loaded into a press where at least one or both of the press platens are quartz, in order to allow UV radiation from a UV lamp to pass unabated to the gasket seal epoxy. Exposure time and flux rates are process parameters determined by the equipment and adhesive materials. Thermally cured epoxies may require that the top and bottom platens of a thermal press be heated. The force that can be generated between the press platens is typically many pounds. With thermally cured epoxies, after the initial press the arrays are typically transferred to a stacked press fixture where they can continue to be pressed and post-cured. In one embodiment, the epoxy between the first wafer and sealing wafer is only partially cured so as to allow easier removal of the sealing wafer. After the sealing wafer is removed, this epoxy can be optionally cured. An epoxy can be selected that adheres less well (depending upon the wafer materials) than other epoxies, so as to allow for easier removal of the sealing wafer after singulation. Also, UV epoxy and IR epoxy can be used at the same time, with the UV epoxy being cured prior to IR cure.

Once the wafers have been bonded together to form a wafer assembly, the assembly can be separated into individual dies. Scribes are placed on the respective substrates in an offset relationship at least along one direction. The units are then separated, resulting in each unit having a ledge on each end of the die. Though not necessary, this can aid in the ability to later remove the sealing safer portion of the die. Such a ledge can also allow for electrical testing of each die, as electrical contacts can be exposed on the ledge (e.g., if circuitry has been formed together with the microstructures on the first wafer). The parts can then be separated from the array by venting the scribes on both substrates. Automatic breaking can be done by commercially available guillotine or fulcrum breaking machines. The parts can also be separated by hand.

Separation may also by done by glass scribing and partial sawing of one or both substrates. Sawing is preferably done in the presence of a high-pressure jet of water. Moisture must not be allowed to contact the microstructures. Therefore, at gasket dispense, an additional gasket bead must be dispensed around the perimeter of the wafer, or each gasket bead around each die must fully enclose the die area so that water can not enter and touch the microstructures. Preferably, however, the end of each scribe/saw lane must be initially left open, to let air vent during the align and press processes. After the array has been pressed and the gasket material fully or partially cured, the vents are then closed using either the gasket or end-seal material. The glass is then scribed and sawed.

Alternatively, both the first wafer and sealing wafer substrates may be partially sawed prior to part separation. With the same gasket seal configuration, vent and seal processes as described above, saw lanes are aligned to fiducials on the sealing substrate. The glass is sawed to a depth between 25% and 95% of its thickness. The first wafer substrate is sawed and the parts separated as described above.

The first wafer can be any suitable substrate for the particular MEMS microstructure (and optionally circuitry) formed thereon, such as a light transmissive substrate such as glass, borosilicate, tempered glass, quartz or sapphire, or any other suitable light transmissive material. Or, the first wafer could be a metal, ceramic or preferably a semiconductor wafer (e.g. silicon or GaAs). The sealing wafer is preferably from a material that is easy to handle, inexpensive and separable from the epoxy after singulation. The sealing wafer can be from any of the above materials for the first wafer, and in one embodiment, the sealing wafer is selected to have a similar coefficient of thermal expansion as the first wafer. In another embodiment, the sealing wafer is a from a polymer material that can be scribed or sawed and broken at the time of singulation. Of course, the polymer should have a melting point higher than any temperatures used in bonding (e.g. for an IR full or partial cure).

After singulation, the sealing wafer is removed. In one embodiment, the sealing wafer is removed by mechanical means, such as by prying the two substrates apart and preferably utilizing the ledges formed by offset scribing as mentioned above. Or, depending upon the type of bonding used, or if adhesive is used, the type of adhesive, it may be preferred to heat the die in order to loosen the bond between the first wafer portion and the sealing wafer portion. In one particular embodiment, epoxy is dispensed (during bonding) on a layer of sacrificial material (this material could be anything that could be removed with a suitable etchant, such as amorphous silicon, silicon dioxide, an organic material, etc.). At the time of removing the sealing wafer portion at the die level, an etchant is provided to the die to etch away this sacrificial material adjacent the dispensed epoxy. By fully or partially removing the sacrificial material, the epoxy will not longer be in contact with both substrates and the substrates will separate. In one embodiment, the sacrificial material is a layer covering substantially all of one surface of the sealing wafer. Upon etching away this surface during sealing wafer removal, the sealing wafer will be removable from the first wafer so as to expose the first wafer having the microstructures (and cured epoxy) thereon.

In some embodiments it may be desirable to add a replacement cover to each die before or during packaging (or even after packaging, though it is desirable in many instances to recover the microstructures as soon as possible. The replacement substrate can be attached directly to the first substrate portion, or to packaging components and held in place over the first substrate portion. The replacement substrate ("third substrate") if bonded directly to the first substrate, can be bonded by any of the known wafer bonding methods, such as those disclosed herein. In one embodiment, the replacement wafer is bonded by epoxy bonding (UV, IR/oven bake, etc.). The epoxy can be applied in the same location as the epoxy was applied for the sealing wafer, or the epoxy can be applied with spacers (the same as or larger than those for the sealing wafer if the cured epoxy and spacers remain on the first substrate after sealing wafer removal).

Though the sealing wafer may be of an inexpensive and disposable material, it may be desired for the replacement substrate to be of a higher quality material, such as a silicon substrate, or a quartz or sapphire substrate, or a glass substrate with particular properties or coatings (UV block, etc.). In some cases, such as for optical switching, projection displays, or other optical applications, it may be desirable to use display grade glass as the third substrate. Though display grade glass could be added at the wafer level and left in place after singulation, the amount of display grade glass can be minimized by first testing the individual dies and only adding the more expensive third substrate to those dies that pass the testing phase. Also, sawing and other singulation steps can damage display grade glass and or glass coatings. Therefore, using a disposable substrate for wafer singulation and adding the display grade glass at the end, can help to minimize damage.

Figure 8:
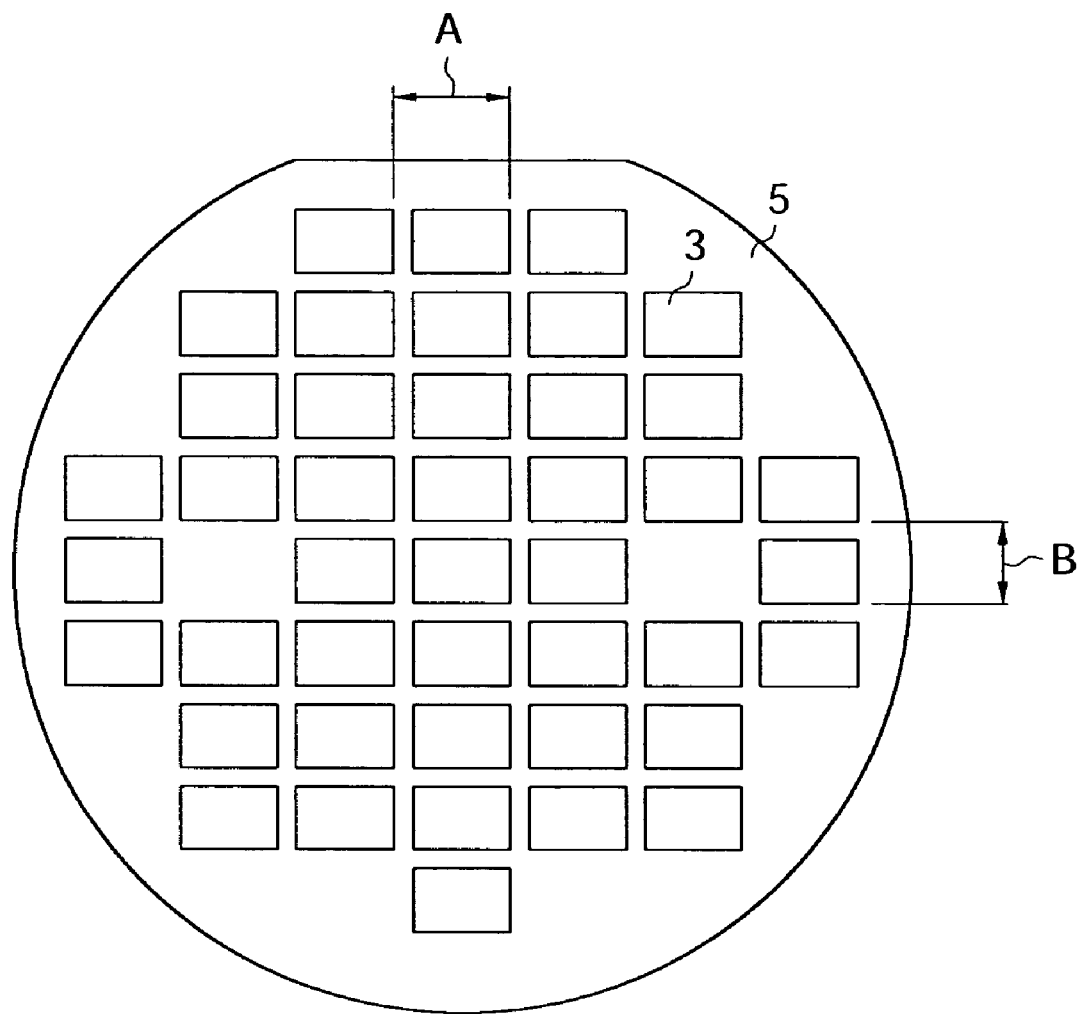
FIG. 8 is a top view of a wafer substrate having multiple die areas.

As an example, reference is made to FIG. 8 where 45 die areas have been formed on wafer 5. Each die area 3 (having a length A and a height B) comprises one or more (preferably released) microstructures. In the case of micromirror arrays for projection systems, each die preferably has at least 1000 movable mirrors, and more likely between 1 and 6 million movable elements. Of course, if the microstructure is a DC relay or RF MEMS switch (or even mirrors for an optical switch) there will likely be far fewer than millions of microstructures, more likely less than 100 or even less than 10 (or even a single structure). Of course if there are only a few microstructures in each die area, then the die areas themselves can be made smaller in most cases. Also, the die areas need not be rectangular, though this shape aids in epoxy deposition and singulation.

Figure 9A:
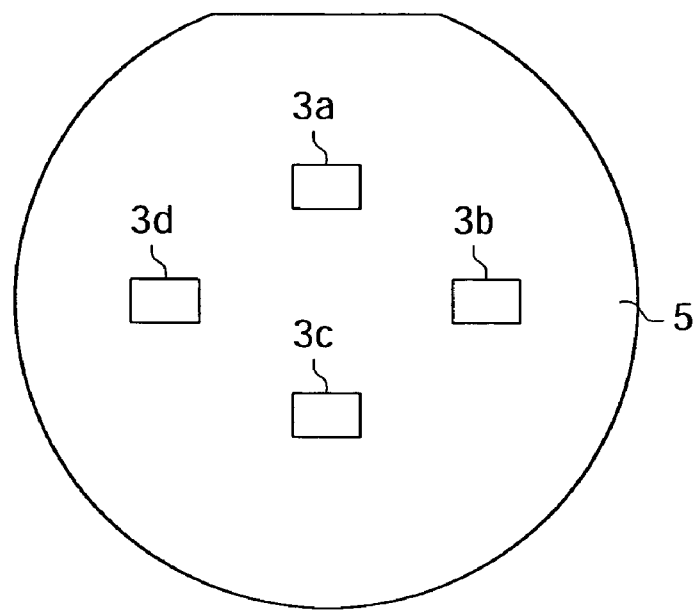
FIGS. 9A to 9G are step-by-step views of the device being made.
Figure 9B:
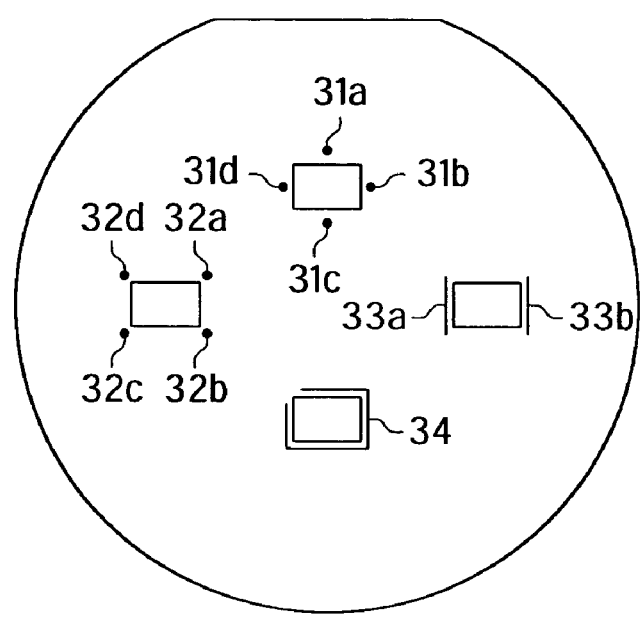

As can be seen in FIG. 9A, four die areas 3a to 3d are formed on wafer 5 (many more dies would be formed in most circumstances, though only four are shown for ease of illustration). Each die area 3a to 3d comprises one or more microstructures that have already been released in a suitable etchant. As illustrated in FIG. 9B, epoxy can be applied in the form of beads 31a to 31d along each side of the die area, or as beads 32a to 32d at each corner of the die area. Or, epoxy ribbons 33a and 33b could be applied along two sides of each die, or a single ribbon 34 could be applied substantially surrounding an entire die. Of course many other configurations are possible, though it is desirable that the die not be fully surrounded with an epoxy gasket as this will prevent air or other gas from escaping when the two wafers are pressed together during a full or partial epoxy cure. And, of course, it is preferable, for higher manufacturing throughput, to use a common epoxy application method throughout the entire wafer (the different types of applications in FIG. 9B are for illustrations purposes only). Also, the areas in which epoxy is applied can first have a sacrificial material deposited in that area (preferably in an area larger than the bead or band of epoxy due to expansion of the epoxy under compression). The sacrificial material could also be applied to the entire wafer except in areas having microstructures thereon.

Figure 9C:
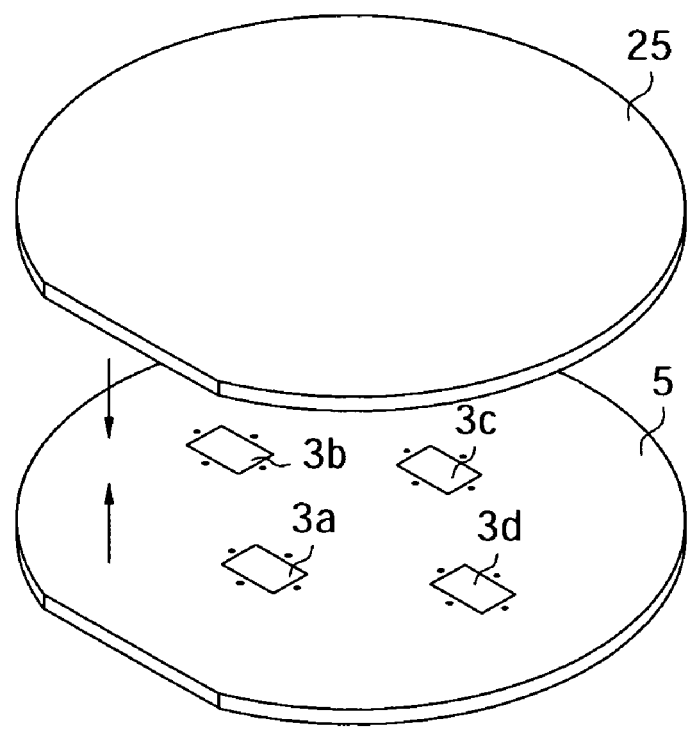

In FIG. 9C, the sealing wafer 25 and the lower substrate wafer 5 with microstructures (and optionally circuitry) are brought into contact with each other. The final gap between the two wafers can be any size that allows the two wafers to be held together and singulated uniformly. Because gasket beads will expand upon application of pressure (thus taking up valuable real estate on a wafer with densely positioned die areas), it is preferable that the gap size be larger than 1 um, and preferably greater than 10 um. The gap size can be regulated by providing microfabricated spacers or spacers mixed in with the epoxy (e.g. 25 um spacers). However, spacers may not be necessary depending upon the type of microstructure and the amount of pressure applied.

Figure 9D:
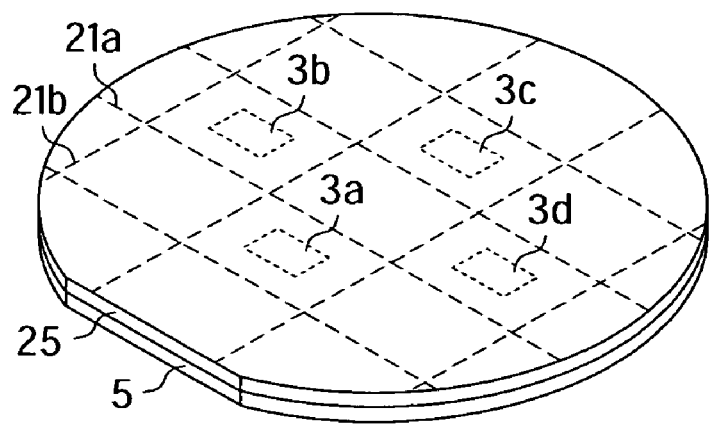
Figure 9E:
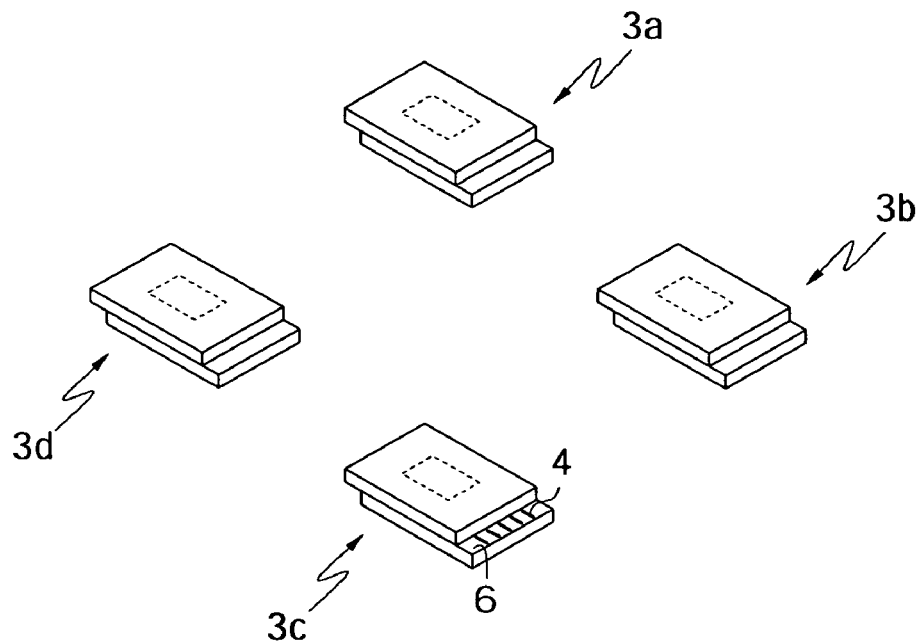
Figure 9F:
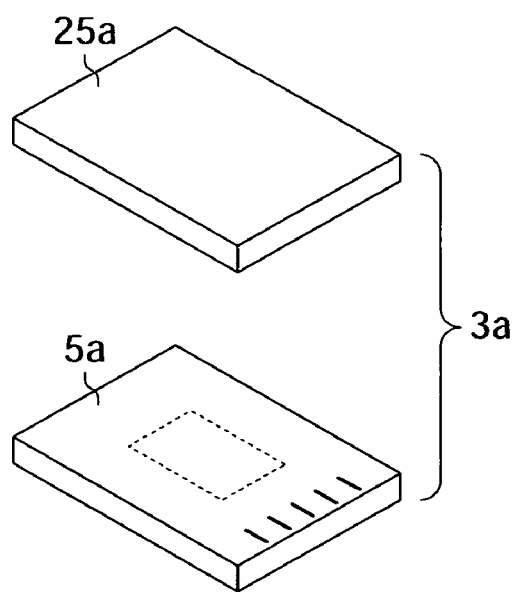
Figure 9G:
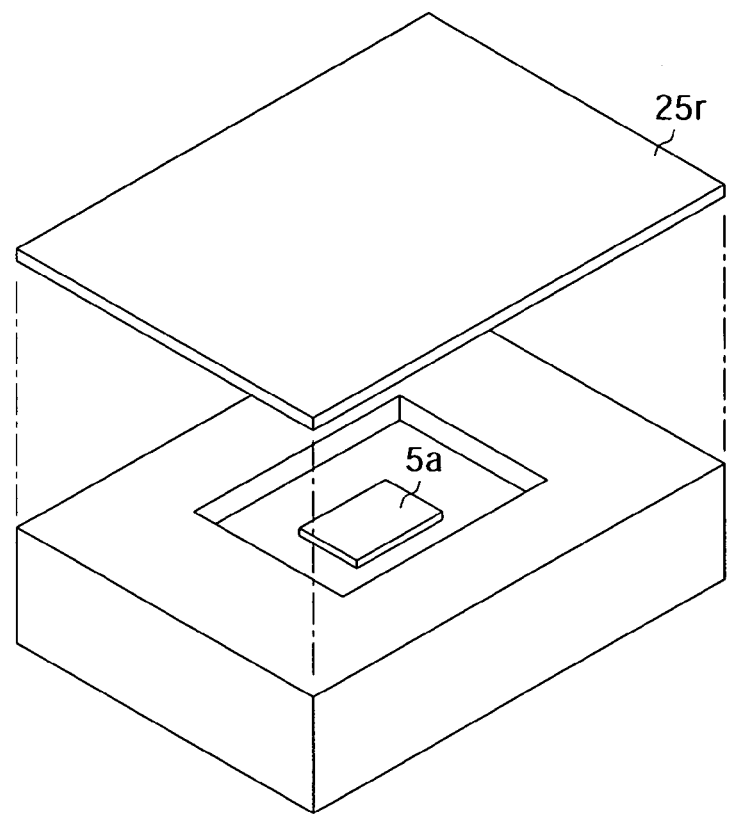

FIG. 9D shows the first wafer 5 and sealing wafer 25 bonded together. Horizontal and vertical score or partial saw lines 21a and 21b are provided on both the sealing wafer 25 and the first (lower) wafer 5 (lines not shown on wafer 5). Preferably the score lines on the two wafers are offset slightly from each other at least in one of the (horizontal or vertical). This offset scoring or partial sawing allows for ledges on each die when the wafer is completely singulated into individual dies (see FIG. 9E). Electrical connections 4 on ledge 6 on die 3c allow for electrical testing of the die prior to removal of the sealing wafer portion. Should the die fail the electrical testing of the microstructures, the sealing wafer need not be removed and the entire die can be discarded. Otherwise, sealing wafer portion 25a (in FIG. 9F) is removed from first wafer portion 5a so as to expose the microstructures on first wafer portion 5a. Sealing wafer portion 25a is discarded. The device can be electrically and/or optically tested with the sealing wafer portion 25a before or after removal. The device can be packaged, which packaging can include a replacement substrate 25r (see FIG. 9G) placed and bonded above the first wafer portion 5a, though not bonded directly to first wafer portion 5a. It is also possible to attach the die/device into a package prior to removing the sealing wafer. This allows protection of the device up till the final package closure and thus minimizes the number of processing steps performed while the micromechanical structures are not covered. Replacement substrate 25r can be a simple glass, silicon, polymer or other substrate, depending upon whether optical transmissivity is needed and other needs of the packaged device. If the microstructures on first wafer portion 5a were formed in the absence of circuitry for interacting with the microstructures (e.g. detecting or causing movement of the microstructures), then the replacement substrate 25r could include such circuitry (including electrodes if desired). Such a replacement substrate could be like the backplane described herein that comprises CMOS circuitry and electrodes for causing deflection of micromirrors on first wafer portion 5a. If the microstructures were formed monolithically with circuitry on the same wafer, then replacement substrate 25b could be a glass cover that might have special coatings or properties such as a UV block, antireflection coating, etc. as mentioned above.

Figure 10A:
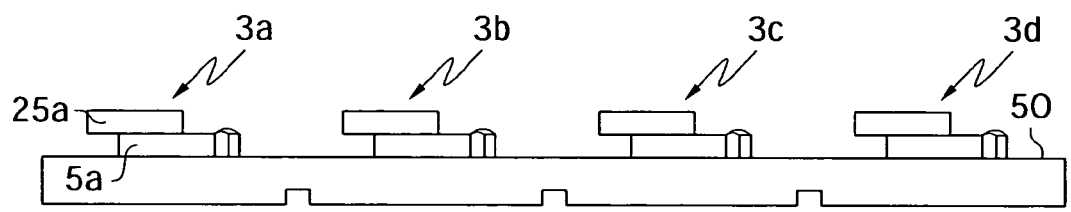
FIGS. 10A to 10G are cross sectional views of one embodiment for packaging the invention.
Figure 10B:
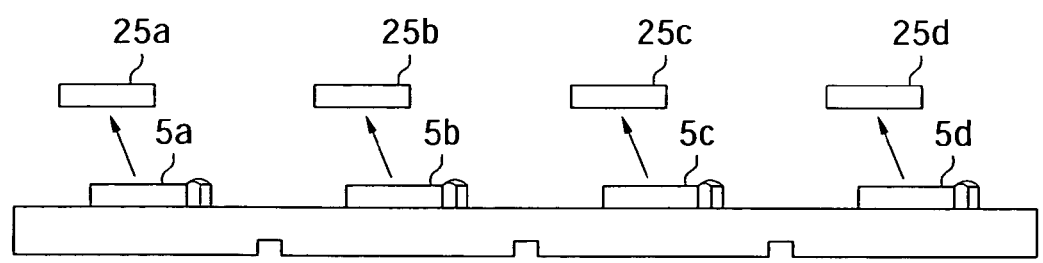
Figure 10C:
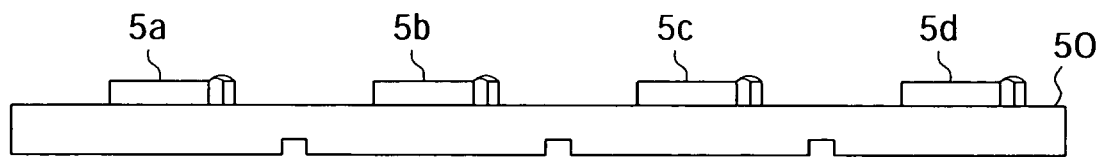
Figure 10D:
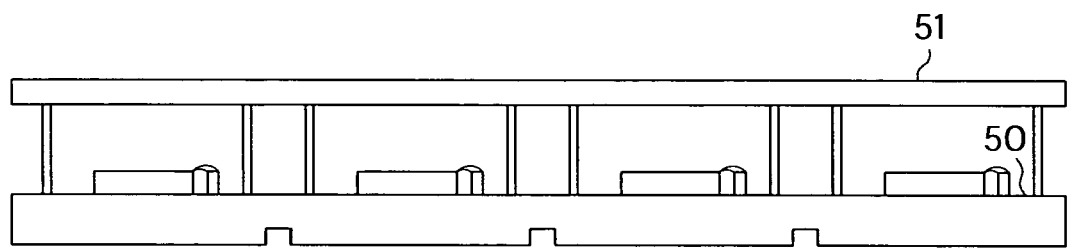
Figure 10E:
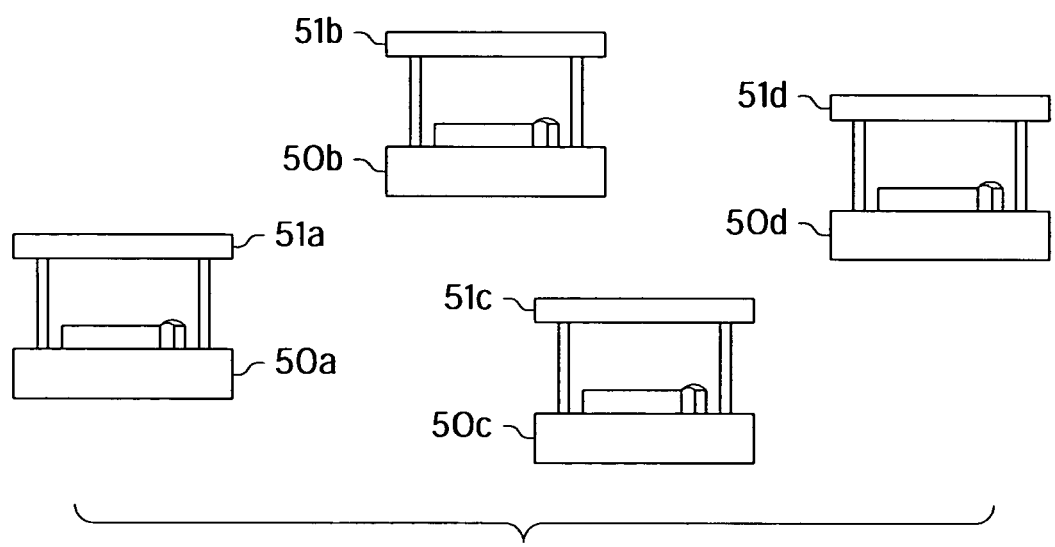
Figure 10F:
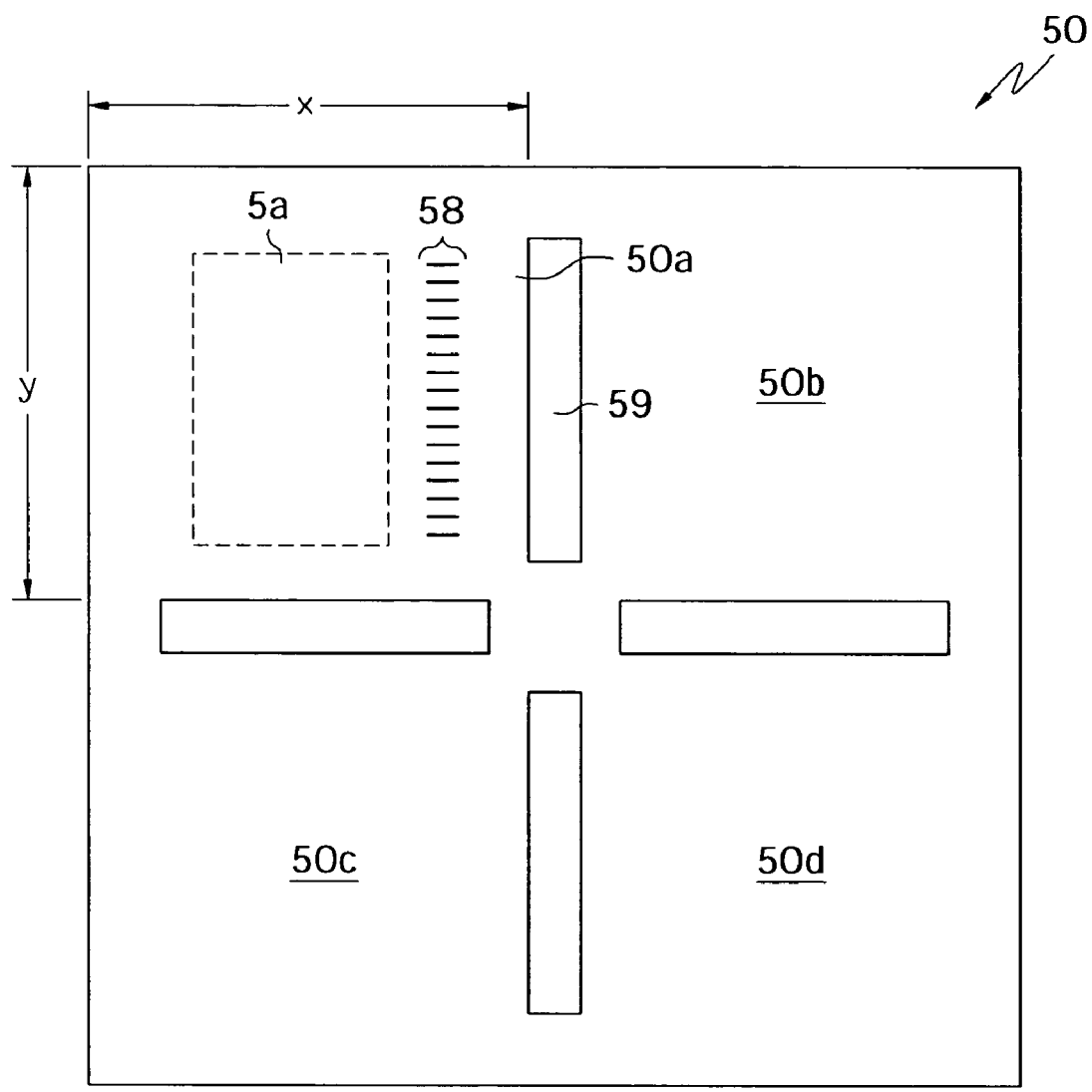
Figure 10G:
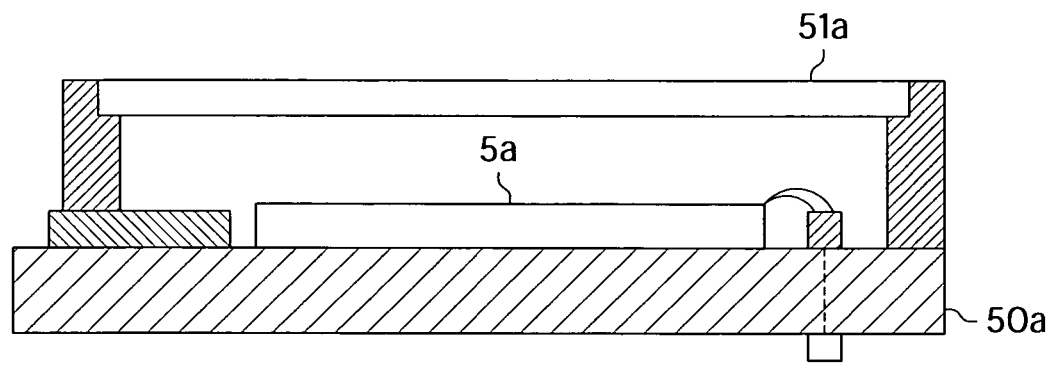

There are a number of possibilities for testing and packaging the MEMS devices. In one embodiment, the devices of FIG. 9E can be bonded to a wafer or panel 50 (e.g. made of ceramic) as can be seen in FIG. 10A. Then the sealing wafer portions 25a to d are removed as in FIG. 10B, after which the remaining first wafer portions 5a to d are wirebonded to panel 50 as illustrated in FIG. 10C. The wirebonding could also be performed prior to removal of sealing wafer portions 25a to d. Then, first wafer portions 5a to d are encapsulated by another panel 51 (this can be a hermetic seal) as shown in FIG. 10D, before being separated into individual packaged units 54a to d as illustrated in FIG. 10E. Panel 51 is the replacement substrate mentioned hereinabove, and can be display quality glass for optical MEMS devices. An alternative panel 51 is shown in FIG. 10F, having sections 50a to d separated by precision formed gaps 59 that allow for exact X and Y dimensions for kinematic mounting (e.g. in a projection system). First substrate portion 5a will be adhered as illustrated by the dotted lines, after each panel section 50a to d has been broken off or otherwise disconnected from the single panel 50. Electrical connections 58 are for wirebonding of first substrate portion 5a, and go through the panel section to the backside. A single packaged structure is shown in more detail in FIG. 10G.

Figure 11A:
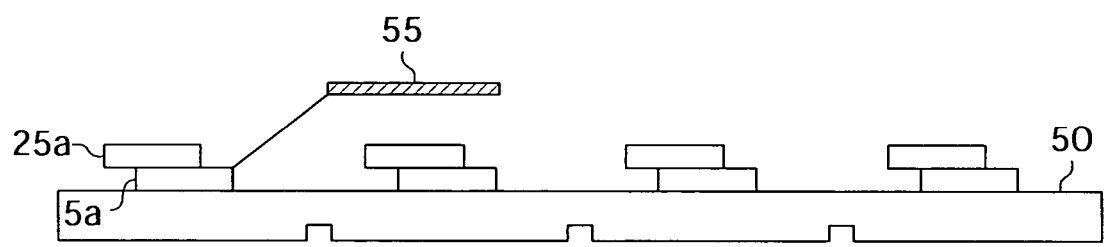
FIGS. 11A to 11D are illustrations of different embodiments for electrical testing of the micromechanical structures of the invention.
Figure 11B:
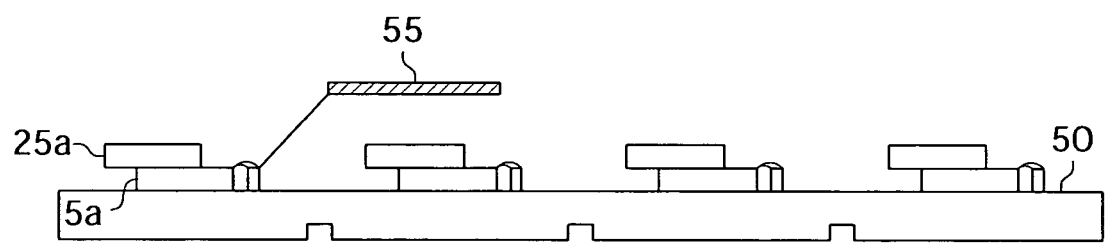
Figure 11C:
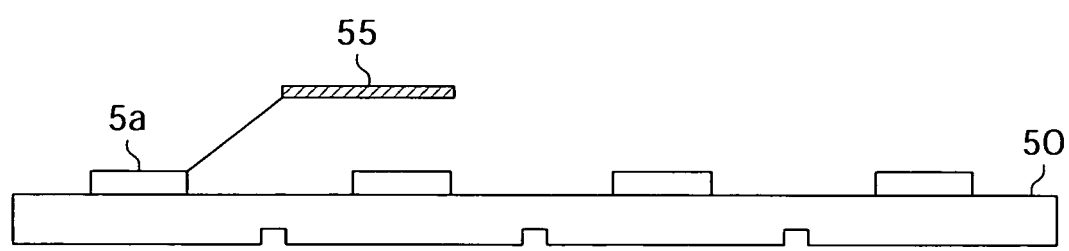
Figure 11D:
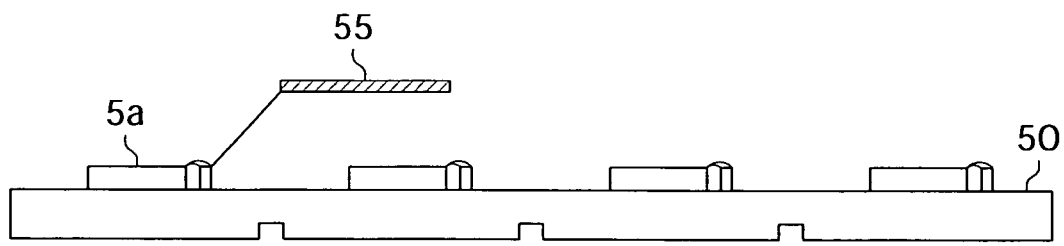

Testing of the MEMS devices can be performed at one or more points in the manufacturing process. As can be seen in FIG. 11A, an electrical testing probe 55 (such as used for testing integrated circuits or one specially designed for MEMS applications) can be used to test the MEMS structures formed on first wafer portion 5a while sealing wafer portion 25a is still attached. Or, as can be seen in FIG. 11B, if first wafer portion 5a is wire bonded to panel 50, then the probe can be directed to come in contact with panel 50 instead of the ledge of first wafer portion 5a. It is also possible to first remove sealing wafer portion 25a in order to create more room for the tips of the electric probe 55 to come into contact with first wafer portion 5a (see FIG. 11C). Or, as above, first wafer portion 5a can be wirebonded to panel 50 and the probe 55 brought into contact with panel 50 for testing of the MEMS structures, as shown in FIG. 11D.

Specific testing can include individual actuation of the one or more MEMS structures on first wafer portion 5a and viewing the movement of the structures optically and/or capturing the movement with an image capture device such as a CCD camera. If the MEMS structures are provided as multiple structures such as an array of micromirrors, each mirror could be actuated individually, or groups of mirrors (or even the entire array) could be actuated to determine whether each structure is within specifications (e.g. desired distance of movement for voltage applied). This electrical testing can be performed prior to fully packaging the devices (e.g. when the devices have been singulated and optionally adhered to the back package panel 50) in order to avoid the expense of packaging devices that do not function properly. The electrical testing can also be performed after packaging, or only after packaging the devices if desired. Any electrical testing can be in addition to other types of testing (e.g. optical testing/inspection) performed at the wafer level.

Figure 12A:
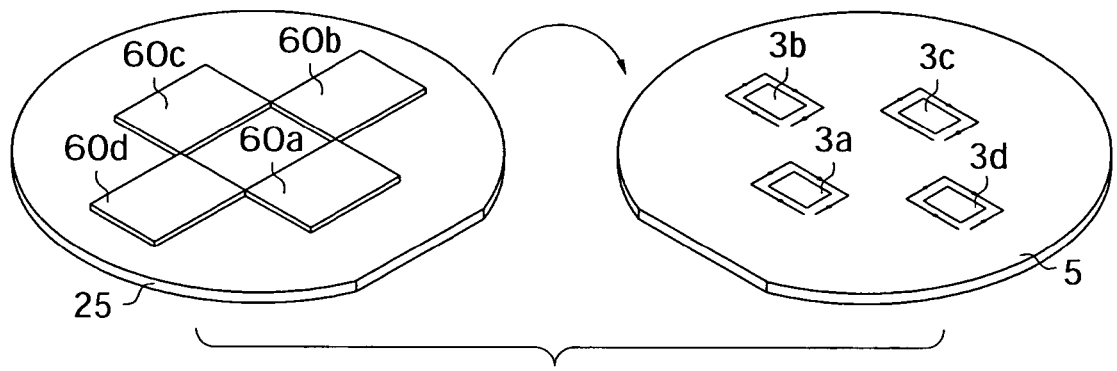
FIGS. 12A to 12D are illustrations of an alternate embodiment of the invention.
Figure 12B:
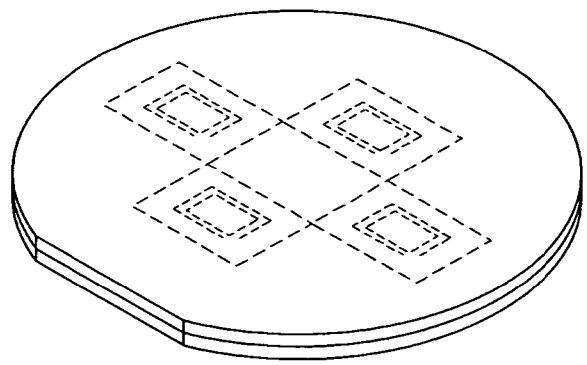
Figure 12C:
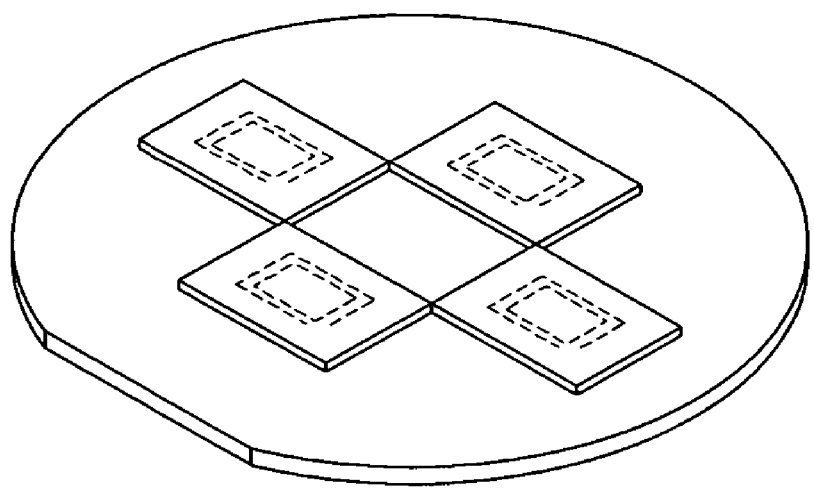
Figure 12D:
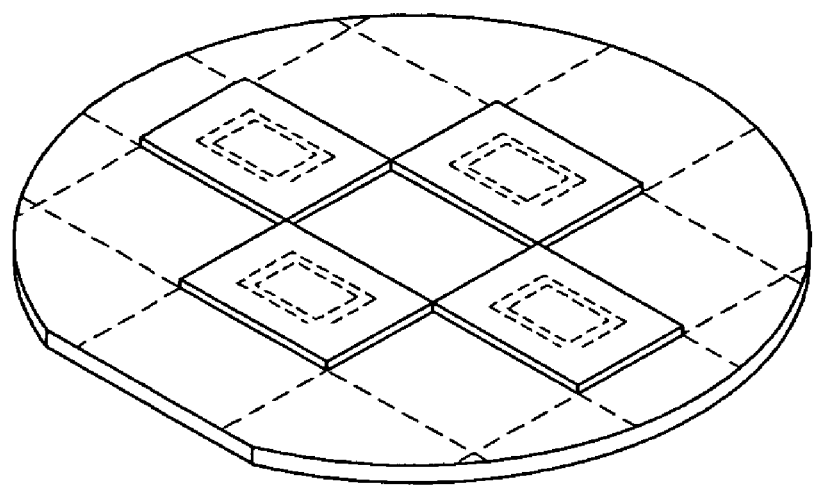

FIGS. 12A to 12D show a variation of the process of the invention where sealing wafer 25 of FIG. 9C is a wafer having rectangular sealing wafer portions 60a to d bonded thereto. A gasket of epoxy 34 is applied around each die area 3a to d, as can be seen in FIG. 12A. Then wafers 25 and 5 are brought together (FIG. 12B) so as to adhere sealing wafer portions 60a to d to a corresponding die area. The adhesive that holds sealing wafer portions 60a to d to wafer 25 can lose its bonding strength by application of UV light or heat so as to allow removal of wafer 25 without removing sealing wafer portions 60a to d, as can be seen in FIG. 12C. Then, as can be seen in FIG. 12D, the first wafer 5 is scored to allow separation of the individual dies. It is also possible to adhere sealing wafer portions other than with epoxy, such as with metal solder. Also, wafer 25 is optional as sealing wafer portions 60a to d can be added individually one at a time or, together at the same time with a bonding machine having a specialized head piece for holding the separate sealing wafer portions. The sealing wafer portions do not have micromachined structures thereon as the process disclosed herein is not a MEMS transfer process. The micromechanical elements are disposed on the first wafer portion both before and after any sealing wafer (or sealing wafer portions) are added and later removed. Other types of removable sealing caps could be used, including glass, plastic, ceramic or other caps, preferably where a cavity is part of the cap or where protrusions or a sealing rim on the cap or substrate, or spacers added at the time of bonding, allow for a cavity or headspace above each die region of the substrate comprising the multiple MEMS devices. Regardless of the material of the cap, the cap need not be light transmissive—though transmissivity is preferred if optical testing or other optical or visual inspection is desired prior to removal of the cap.

It should be noted that the invention is applicable to forming micromirrors such as for a projection display or optical switch, or any other MEMS device that would benefit from protection of the microstructures during wafer singulation. If an optical switch is the microstructure being protected, mirrors with multiple hinges can be provided on the first wafer so as to allow for multi-axis movement of the mirror. Such multi-axis movement, mirrors for achieving such movement, and methods for making such mirrors (including providing a reinforcing layer and removing a portion in the hinge area) are disclosed in U.S. patent application Ser. No. 09/617,149 to Huibers et al., the subject matter of which is incorporated herein by reference. Formation of multi-axis mirrors on a substrate, bonding a sealing wafer, and removing the sealing wafer after singulation, is described in U.S. patent application 60/231,041 to Huibers, the subject matter of which is incorporated herein by reference.

Of course, the microstructure need not be a movable mirror (for a projection display, for optical switching, or even for data storage), but could be one or more accelerometers, DC relay and RF switches, microlenses, beam splitters, filters, oscillators and antenna system components, variable capacitors and inductors, switched banks of filters, resonant comb-drives and resonant beams, etc. Any MEMS structure, particularly a released or movable structure, could benefit from the method utilizing a removable sealing wafer described herein.

Figure 13A:
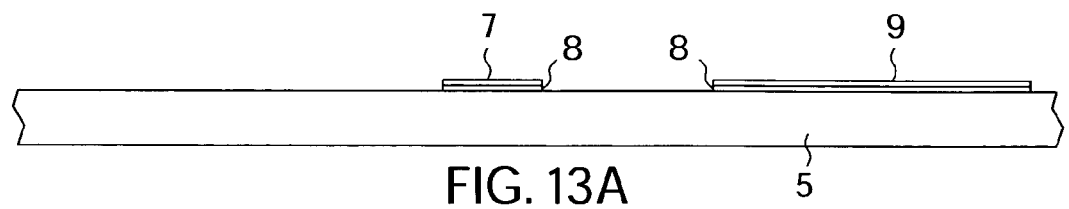
FIGS. 13A to 13G are illustrations of a further embodiment of the invention.

The microstructure need not be formed and released by standard microfabrication techniques (for example, for surface micromachining, sacrificial layer deposition, followed by thin film deposition and patterning, followed by removal of a sacrificial layer to release the MEMS structure; or for bulk micromachining, releasing the microstructure by etching into the substrate). Instead, the microstructure could be formed and released by etching all the way through a substrate so as to define (and release) the movable element. For example, as can be seen in FIG. 13A, the first wafer substrate 5 (or multiple wafers laminated/bonded together) are provided, upon which are deposited electrodes 7, 9 which are electrically isolated from each other. CMOS or other circuitry can be provided on wafer 5 for actuating the MEMS device to be formed, or the circuitry can be formed on a separate substrate from the MEMS device. Insulating layer 8 is deposited prior to deposition of the electrodes, if the lower substrate wafer is not insulating. Layer 8 could alternatively be a layer for promoting adhesion of the electrodes to the lower substrate wafer.

Figure 13B:
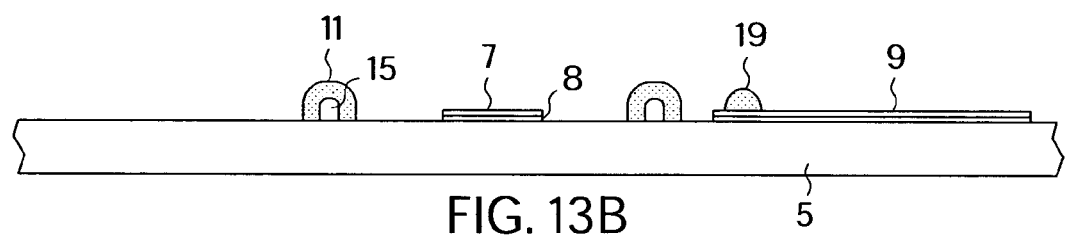

In FIG. 13B, micro-fabricated spacers 15 are deposited onto first substrate wafer 5, and an epoxy, polymer, or other adhesive 11 (e.g. a multi-part epoxy, or a heat or UV-cured adhesive) is dispensed adjacent to the micro-fabricated spacers 15. The adhesive and spacers need not be co-located as illustrated, but could be deposited in different areas on the lower substrate wafer. Alternative to glue, a compression bond material could be used that would allow for adhesion of the upper and lower wafers. Spacers 15 could be micro-fabricated onto the lower wafer (or the upper wafer) and could be made of polyimide, SU-8 photo-resist. Conductive adhesive 19 (or adhesive together with metallic spacers) is provided on electrode 9 for electrically connecting electrode 9 to the movable element to be formed in the upper wafer. Depending upon the size of the movable element to be formed, the spacers could be microfabricated with standard thin film materials (silicon dioxide, silicon nitride, etc.). Instead of microfabrication, the spacers could be balls or rods of a predetermined size that are within the adhesive when the adhesive is placed on the lower wafer.

Figure 13C:
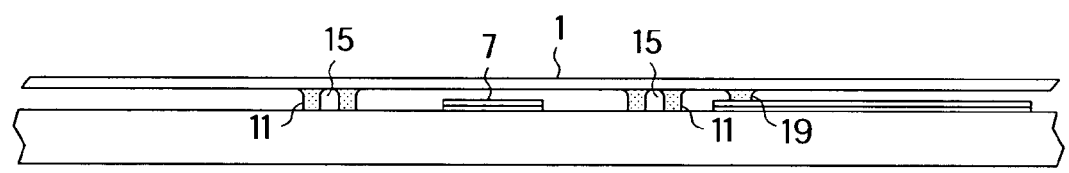

As can be seen in FIG. 13C, wafer 1 (the wafer from which the microstructure is to be formed) is aligned and bonded to the lower substrate wafer 5. Preferably the MEMS wafer and the first wafer are bonded with sufficient pressure so that both wafers contact opposite sides of the spacers (or spacing wafer). If curing of the adhesive is necessary, such curing can be fully or partly performed at this stage in the assembly. In a preferred embodiment the upper and lower wafers are made of the same material (preferably silicon), or at least have the same or nearly identical thermal coefficient of expansion (so as to avoid or reduce warping or stress-induced change in device performance over a wide temperature range. However, it is not necessary for the first wafer 5 and the MEMS wafer 1 to be the same.

Figure 13D:
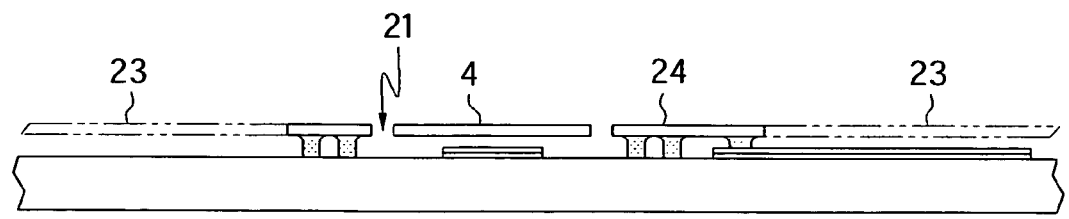
Figure 13E:
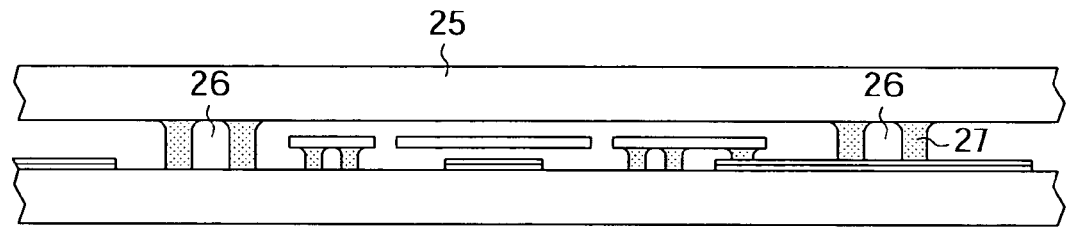

FIG. 13D shows that if the movable elements have not already been cut or etched out of upper wafer 1 prior to bonding, then at this point portions 21 of the MEMS wafer are removed so as to define the movable element 17 (and possibly also the hinge which allows pivoting or other movement of element 17). Portions 21 can be removed by standard microfabrication removal procedures (e.g. a Bosch deep-RIE silicon etch with an oxide etch mask) or by macro-fabrication methods (e.g. laser cutting). As can be seen in FIG. 13D, portions 23 (dotted line areas) can also be removed so as to separate the MEMS movable elements from each other. This provides for individual addressing if a common electrode is used. Removal of portions 23 also creates space for larger spacers 26 and adhesive/epoxy 27, for the addition of a sealing wafer 25 (see FIG. 13E). Wet or dry (plasma or non-plasma) etchants can be used (for forming gaps 16 and removing portions 23), or combinations thereof, depending upon the material or combination of materials or layers in the upper wafer.

Unless wafer 1 is a reflective metallic wafer (e.g. Al), or is a wafer laminate made up of multiple wafers (one of which is reflective), or is a wafer previously coated with one or more metallic and/or reflective layers, then it may be desirable at this point to metalize at least movable element 17 with a reflective layer (assuming the ultimate microstructure should have high reflectivity such as a micromirror in a projection display or optical switch). Metalization can be performed (with care to prevent shorting) by, e.g. using shadow-mask evaporation, though other metalization techniques are possible.

Sealing wafer 25 is bonded onto lower substrate wafer 5 by means of epoxy 27, and is held apart from lower wafer 5 and movable element 17 by means of spacers 26 (of larger size than spacers 10). Alternatively, portions 23 need not be removed, and additional spacers and epoxy could then be placed upon portions 23 or 24 of FIG. 13D, with the sealing wafer 25 added thereon. An intermediate wafer (with portions cut-out or etched corresponding to the position of the movable element) could be provided instead of spacers as long as the bonding method used for bonding the intermediate spacing wafer allows for removal of the sealing wafer after singulation.

If the sealing wafer is to be removed, it need not be of a light transmissive material, and can be non-permanently adhered (e.g. partially cured) onto the upper or lower wafer. The sealing wafer protects the movable elements and lower electrodes and circuitry during singulation (cutting of the wafers into arrays or individual optical beam steering devices). In one embodiment the sealing wafer is removed after singulation and replaced by a new cover bonded or glued in place at an angle to the other wafers (so as to minimize surface reflections when used as a beam steering device in an optical switch). To facilitate cover removal, UV or IR cure glue can be used and run through the singulation (e.g. cutting or scribing) process without curing (or a small amount of curing)—the glue viscosity can be sufficient to prevent significant movement. The epoxy can then be cured after the sealing wafer is removed, and in one embodiment, the same partially cured or uncured epoxy can be used to adhere the replacement substrate.

Figure 13F:
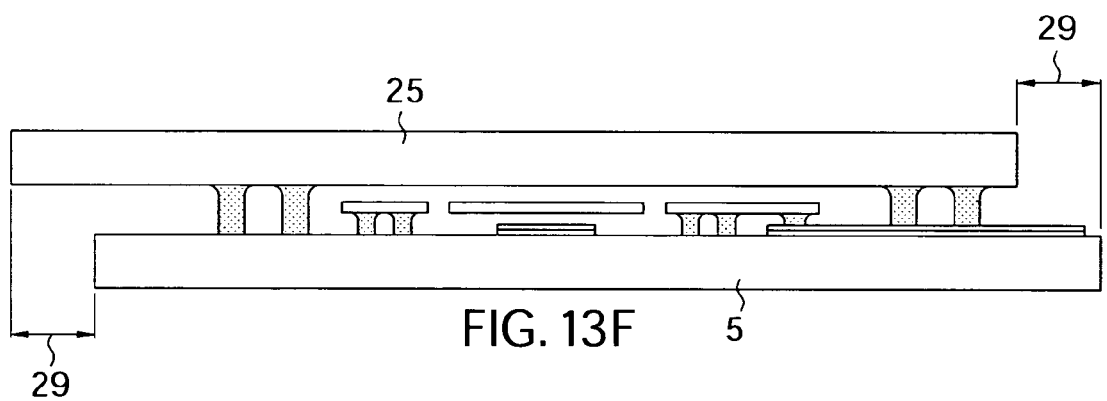
Figure 13G:
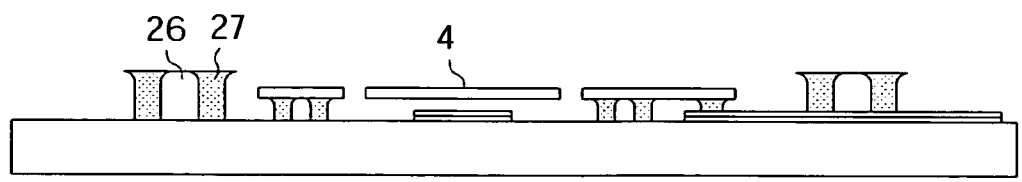

FIG. 13F shows the wafer assembly after singulation, which can be performed to result in cut edges 29. If the gap between the sealing wafer 25 and the first wafer 5 is large enough, a standard wafer saw can cut all the way through. FIG. 13G shows the assembly after removal of the sealing wafer. By adding and removing the sealing wafer, the sensitive surface of the movable microstructures are protected by dust and debris during the singulation process. Also, such a method of forming an assembly of wafers as disclosed herein has a low thermal budget, which allow for the integration of silicon circuitry on the first wafer.

The invention has been described in terms of specific embodiments. Nevertheless, persons familiar with the field will appreciate that many variations exist in light of the embodiments described herein.

We claim:

1. A method for making a micromirror device, the method comprising:
   - forming circuitry, electrodes and micromirrors in a plurality of die areas on a silicon wafer;
   - bonding a light transmissive sealing wafer in spaced apart relation to the silicon wafer;
   - after the bonding, singulating the bonded wafers into individual dies; and
   - removing the light transmissive sealing wafer from the silicon wafer.

2. The method of claim 1, further comprising providing an anti-stiction layer on the micromirrors.

3. The method of claim 1, wherein the singulation of the bonded wafers comprises scoring and breaking the bonded wafers into individual dies.

4. The method of claim 1, wherein the singulation comprises separating the light transmissive sealing wafer and the silicon wafer such that after singulation an edge of a silicon substrate of an individual die is offset from an edge of a light transmissive substrate of an individual die leaving an exposed area on the silicon substrate.

5. The method of claim 4, wherein the bonding comprises application of an adhesive and a spacer.

6. The method of claim 5, wherein the adhesive is an epoxy.

7. The method of claim 5, wherein the separation is performed by sawing with pressurized water.

8. The method of claim 1, wherein the light transmissive sealing wafer is a glass wafer.

9. The method of claim 8, wherein the glass sealing wafer is display grade glass.

10. The method of claim 8, wherein the micromirrors on each die are at least 1000 mirrors.

11. The method of claim 10, wherein between 1 and 6 million mirrors are provided on each die.

12. The method of claim 11, wherein each die area is rectangular.

13. The method of claim 4, further comprising after singulation electrically testing each die at the exposed area of the silicon substrate of the die.

14. The method of claim 13, further comprising discarding dies that fail the electrical testing.

15. The method of claim 13, wherein testing of the dies further comprises optically testing each die after singulation.

16. The method of claim 8, further comprising attaching each die into a package.

17. The method of claim 1, further comprising attaching a plurality of dies onto a single packaging substrate.

18. The method of claim 17, wherein the packaging substrate is a ceramic substrate.

19. The method of claim 1, further comprising attaching each die after wafer singulation to a packaging substrate.

20. The method of claim 19, further comprising wirebonding each die to the packaging substrate.

21. The method of claim 17, further comprising wirebonding the plurality of dies to the packaging substrate, followed by singulating the packaging substrate.

22. The method of claim 1, wherein the plurality of dies are attached and wirebonded to a bottom packaging substrate, and wherein an electrical probe contacts the bottom packaging substrate for testing each die.

23. The method of claim 1, wherein a plurality of dies after singulation are attached to a panel having precision formed gaps that allow for precision X and Y alignment for kinematic mounting in a projection system.

24. The method of claim 1, wherein the silicon substrate for each die after singulation is bonded to a kinematic mounting package.

25. The method of claim 1, further comprising contacting an electrical testing probe to an exposed I/O pad area for testing purposes.

26. The method of claim 4, wherein the exposed area on the silicon substrate of each die is an I/O pad area.

27. The method of claim 26, further comprising connecting to the I/O pad area an external display controller that supports mirroring a displayed image in a horizontal axis and/or vertical axis.

28. The method of claim 25, wherein testing further comprises actuating the micromirrors.

29. The method of claim 28, wherein the testing further comprises viewing movement of the micromirrors optically.

30. The method of claim 28, wherein a camera is used to image capture movement of the micromirrors.

31. The method of claim 30, wherein the camera is a CCD camera.

32. The method of claim 28, wherein each micromirror is actuated individually for optical testing.

33. The method of claim 28, wherein groups of micromirrors are actuated for optical testing.

34. The method of claim 28, wherein a distance of movement of a micromirror is determined for an applied voltage.

35. The method of claim 28, further comprising optical testing prior to singulation of the wafers into dies.

36. The method of claim 1, further comprising providing an intermediate wafer with open areas between the silicon wafer and light transmissive sealing wafer to maintain the silicon wafer and light transmissive wafer in spaced apart relation.

37. The method of claim 1, further comprising forming spacers on the light transmissive sealing wafer prior to bonding the light transmissive sealing wafer to the silicon wafer.

38. The method of claim 1, further comprising an intermediate mirror substrate wherein the micromirrors are etched or cut out of the intermediate mirror substrate.

39. The method of claim 19, further comprising providing the packaged die within a projection system.

40. The method of claim 38, wherein the intermediate mirror substrate is bonded to the silicon wafer and the silicon wafer is further bonded to the light transmissive sealing wafer.

41. The method of claim 38, wherein the intermediate mirror substrate is bonded to the silicon wafer and wherein the intermediate mirror substrate is bonded to the light transmissive sealing wafer.

42. The method of claim 38, wherein the mirrors in the intermediate mirror substrate are formed by a deep RIE silicon etch.

43. The method of claim 42, further comprising a reflecting layer deposited on the intermediate mirror substrate.

44. The method of claim 38, wherein the micromirrors are formed by an RIE etch.

45. The method of claim 43, wherein the reflecting layer is deposited after forming the micromirrors from the intermediate substrate.

46. The method of claim 43, wherein the reflecting layer is deposited before forming the micromirrors from the intermediate substrate.

* * * * *